(12) United States Patent
Kawashima et al.

(10) Patent No.: US 7,919,774 B2
(45) Date of Patent: Apr. 5, 2011

(54) NONVOLATILE MEMORY ELEMENT, NONVOLATILE MEMORY APPARATUS, AND METHOD OF MANUFACTURE THEREOF

(75) Inventors: Yoshio Kawashima, Osaka (JP); Takeshi Takagi, Kyoto (JP); Takumi Mikawa, Shiga (JP); Zhiqiang Wei, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/709,148

(22) Filed: Feb. 19, 2010

(65) Prior Publication Data

US 2010/0200852 A1 Aug. 12, 2010

Related U.S. Application Data

(62) Division of application No. 12/281,034, filed as application No. PCT/JP2007/054277 on Mar. 6, 2007, now Pat. No. 7,692,178.

(30) Foreign Application Priority Data

Mar. 8, 2006 (JP) ................................. 2006-062316

(51) Int. Cl.
*H01L 29/68* (2006.01)
*H01L 21/34* (2006.01)

(52) U.S. Cl. ................ 257/43; 257/5; 257/44; 257/310; 257/E45.003; 257/E21.459; 438/104; 356/148

(58) Field of Classification Search ................ 257/43, 257/44, 5, 192, 296, 310, 421, E29.068, E45.003, 257/E27.004, E27.071; 438/3, 104, 197, 438/240, 381, 785; 365/100, 107, 148, 157, 163, 189.16; 360/324, 326

See application file for complete search history.

(56) References Cited

U.S. PATENT DOCUMENTS

| | | | |
|---|---|---|---|
| 6,849,891 B1 | 2/2005 | Hsu et al. | |
| 2005/0270821 A1 | 12/2005 | Nakano | |
| 2006/0108625 A1 | 5/2006 | Lee et al. | |
| 2009/0097300 A1* | 4/2009 | Ishihara et al. | 365/148 |

FOREIGN PATENT DOCUMENTS

| | | |
|---|---|---|
| JP | 2003-068984 | 3/2003 |
| JP | 2004-349690 | 12/2004 |
| JP | 2004-363604 | 12/2004 |
| JP | 2005-175457 | 6/2005 |
| JP | 2005-317976 | 11/2005 |
| JP | 2005-353662 | 12/2005 |

* cited by examiner

*Primary Examiner* — Victor Mandala
*Assistant Examiner* — Whitney Moore
(74) *Attorney, Agent, or Firm* — McDermott Will & Emery LLP

(57) ABSTRACT

A lower electrode layer 2, an upper electrode layer 4 formed above the lower electrode layer 2, and a metal oxide thin film layer 3 formed between the lower electrode layer 2 and the upper electrode layer 4 are provided. The metal oxide thin film layer 3 includes a first region 3a whose value of resistance increases or decreases by an electric pulse that is applied between the lower electrode layer 2 and the upper electrode layer 4 and a second region 3b arranged around the first region 3a and having a larger content of oxygen than the first region 3a, wherein the lower and upper electrode layers 2 and 4 and at least a part of the first region 3a are arranged so as to overlap as viewed from the direction of the thickness of the first region 3a.

10 Claims, 24 Drawing Sheets

NONVOLATILE MEMORY ELEMENT, NONVOLATILE MEMORY APPARATUS, AND METHOD OF MANUFACTURE THEREOF

RELATED APPLICATIONS

This application is a Divisional of U.S. application Ser. No. 12/281,034, filed on Aug. 28, 2008, now U.S. Pat. No. 7,692,178 which is the U.S. National Phase under 35 U.S.C. §371 of International Application PCT/JP2007/054277, filed on Mar. 6, 2007, claiming priority of Japanese Patent Application No. 2006-062316, filed on Mar. 8, 2006, the entire contents of each of which are hereby incorporated by reference.

TECHNICAL FIELD

The present invention relates to a nonvolatile memory element and a nonvolatile memory apparatus for storing data by the use of a material whose value of resistance varies reversibly by the application of an electric pulse and to a method of manufacture thereof.

With the recent advance of digital technologies in the field of electronics devices, there are increasing demands for larger-capacity nonvolatile memory elements that are used to store data such as music data, image data, information data and so on. A memory element, which employs a material capable of varying in the value of resistance by the application of an electric pulse and of remaining in that state, has attracted attention as a measure to meet the demands.

FIG. 21 is a principal part cross-sectional view illustrating the structure of a first conventional example (see, for example, Patent Document 1) of the aforesaid nonvolatile memory element. In this conventional nonvolatile memory element, a transistor 160 and a nonvolatile memory section 200 are formed on a principal surface of a substrate 110, as shown in FIG. 21. The transistor 160 constitutes a circuit for controlling electric connection of the nonvolatile memory section 200 to a bitline, and is made up of a source region 120, a drain region 130, a gate insulating film 140, and a gate electrode 150. The nonvolatile memory section 200 is provided with a lower electrode 170 connected to the drain region 130, a resistance varying material layer 180 whose value of resistance varies reversibly by a voltage pulse or electric pulse, and an upper electrode 190. In addition, the transistor 160 and the nonvolatile memory section 200, which are formed overlying the substrate 110, are covered by an interlayer dielectric layer 210, and the upper electrode 190 is connected to an electrode wire 220.

Nickel oxide (NiO), vanadium oxide ($V_2O_5$), zinc oxide (ZnO), niobium oxide ($Nb_2O_5$), titanium oxide ($TiO_2$), tungsten oxide ($WO_3$), cobalt oxide (CoO) or the like is employed as the material to form the resistance varying material layer 180. Such a transition metal oxide is known to exhibit a certain resistance value upon the application of a voltage or electric current above the threshold value, and to continue to hold that resistance value until the next application of a different voltage or electric current.

FIG. 22A is a perspective view illustrating the structure of a second conventional example (see, for example, Patent Document 2) of the aforesaid nonvolatile memory element and FIG. 22B is a cross-sectional view depicting a cross section taken along line XXIIB-XXIIB of FIG. 22A. The first conventional example shown in FIG. 21 has a "one-transistor/one-nonvolatile memory section" structure, whereas the second conventional example shown in FIGS. 22A and 22B is of a cross point type in which an active layer lies between a word line and a bit line at their cross point (cross point in three dimensions).

As shown in FIG. 22A, a lower electrode 240 is formed in the substrate 230 on which is formed an active layer 250. An upper electrode 260 is formed on the active layer 250 such that the upper electrode 260 is orthogonal to the lower electrode 240. As shown in FIG. 22B, the region where the lower electrode 240 and the upper electrode 260 three-dimensionally cross over each other serves as a memory region 270, wherein the lower electrode 240 and the upper electrode 260 each function as a word line or as a bit line. In this example, the memory region 270 is a region defined merely for the sake of convenience and the composition thereof is completely the same as the rest. Materials such as $LaAlO_3$, Si, and TiN in amorphous, multi-crystal, or single-crystal form are employed as the material to form the substrate 230. YBCO ($YBa_2Cu_3O_7$) is employed as the material to form the lower electrode 240. Materials whose resistance varies in response to an electric signal applied thereto are employed as the material to form the active layer 250.

Patent Document 1: JP-A-2004-363604
Patent Document 2: JP-A-2003-68984

DISCLOSURE OF THE INVENTION

Problems that the Invention Intends to Overcome

In the first conventional example, the variable resistance layer whose value of resistance varies reversibly by voltage or electric current is formed in the region sandwiched between the upper electrode and the lower electrode. The periphery of the variable resistance layer is usually surrounded by an interlayer dielectric layer (for example, a silicon dioxide film) for use in semiconductor devices. In this case, when etching away the resistance varying material in the region except for the interelectrode region between the upper electrode and the lower electrode, it is likely that the sidewalls of the variable resistance layer remaining in the interelectrode region are subjected to damage, thereby causing degradations in the electric characteristics as well as in the resistance varying characteristics.

In addition, in the second conventional example, the active layer (which is the same as the variable resistance layer) is formed in the region inclusive of all the cross points of the lower electrodes and the upper electrodes, thereby causing no damage to the memory regions. However, the problem is that as the density becomes higher, crosstalk tends to occur between contiguous cross points. This presents a constraint on increasing the capacity to higher levels.

The present invention was invented with a view to overcoming the foregoing problems with the conventional technology. Accordingly, an object of the present invention is to provide a nonvolatile memory element which can be more miniaturized and in addition which can enhance the stability of a variable resistance layer, a nonvolatile memory apparatus provided with such a nonvolatile memory element, and a method of manufacture thereof.

Means for Overcoming the Problems

In order to overcome the foregoing problems, the present invention provides a nonvolatile memory element comprising a lower electrode layer, an upper electrode layer formed above the lower electrode layer, and a metal oxide thin film layer formed between the lower electrode layer and the upper electrode layer, wherein the metal oxide thin film layer includes a first region whose value of resistance increases or decreases by an electric pulse that is applied between the lower electrode layer and the upper electrode layer and a second region arranged around the first region and having a larger content of oxygen than the first region, and wherein the lower and upper electrode layers and at least a part of the first region are arranged so as to overlap as viewed from a direction of a thickness of the first region.

In the aforesaid nonvolatile memory element in accordance with the present invention, the metal oxide thin film layer is preferably formed of a transition metal oxide material. In addition, in the aforesaid nonvolatile memory element in accordance with the present invention, the first and second regions are preferably formed of an identical element. As a result of this configuration, it becomes possible to facilitate the formation of the second region having a larger content of oxygen than the first region.

In addition, in the aforesaid nonvolatile memory element in accordance with the present invention, the second region is preferably formed such that the value of resistance of the second region is larger than the value of resistance of the first region in the case where the value of resistance of the first region increases by the application of an electric pulse between the lower electrode layer and the upper electrode layer. This ensures the prevention of crosstalk, thereby making it possible to realize high-capacity nonvolatile memory elements.

In addition, in the aforesaid nonvolatile memory element in accordance with the present invention, the metal oxide thin film layer may be formed of iron oxide thin film and the first region may be formed of triiron tetroxide ($Fe_3O_4$). Furthermore, the second region may be formed of diiron trioxide ($Fe_2O_3$). As a result of this, the variation characteristics of the value of resistance of the first region are stabilized and in addition the second region becomes substantially an insulator.

The present invention provides a nonvolatile memory apparatus comprising a substrate, a plurality of first electrode wires formed in parallel with each other on the substrate, a plurality of second electrode wires formed above the plurality of first electrode wires so that the plurality of second electrode wires are in parallel with each other within a plane parallel to a principal surface of the substrate, and cross in three dimensions the plurality of first electrode wires, and a plurality of nonvolatile memory elements arrayed in a matrix to respectively correspond to three-dimensional cross points of the plurality of first electrode wires and the plurality of second electrode wires, wherein each of the plurality of nonvolatile memory elements includes a lower electrode layer, an upper electrode layer formed above the lower electrode layer, and a metal oxide thin film layer formed between the lower electrode layer and the upper electrode layer, wherein the metal oxide thin film layer includes a first region whose value of resistance increases or decreases by an electric pulse that is applied between the lower electrode layer and the upper electrode layer and a second region arranged around the first region and having a larger content of oxygen than the first region, wherein the lower and upper electrode layers and the first region are arranged so as to overlap as viewed from a direction of a thickness of the first region, and wherein each of the plurality of first electrode wires and each of the plurality of second electrode wires in the cross region of each of three-dimensional cross points constitute the lower electrode layer and the upper electrode layer, respectively.

In the aforesaid nonvolatile memory apparatus in accordance with the present invention, the metal oxide thin film layers of the plurality of adjacent nonvolatile memory elements may constitute an integral layer. As a result of such a configuration, the step of physically separating the metal oxide thin film layer is no longer required.

In addition, in the aforesaid nonvolatile memory apparatus in accordance with the present invention, each of the metal oxide thin film layers of the plurality of nonvolatile memory elements may have a larger contour shape than that of a cross region as viewed from a direction of a thickness of the metal oxide thin film layer and the metal oxide thin film layers of the adjacent nonvolatile memory elements may be separated from each other.

In addition, in each of the nonvolatile memory elements of the aforesaid nonvolatile memory apparatus in accordance with the present invention, a connection electrode layer may be formed between the first region and the upper electrode layer.

In addition, the aforesaid nonvolatile memory apparatus in accordance with the present invention may further include a semiconductor integrated circuit electrically connected to the lower and upper electrode layers of each of the plurality of nonvolatile memory elements.

In addition, each of the plurality of nonvolatile memory elements of the nonvolatile memory apparatus in accordance with the present invention further includes a rectifier element connected electrically to either the lower or upper electrode layer.

The present invention provides a method of manufacturing a nonvolatile memory element, the memory element including a lower electrode layer; an upper electrode layer formed above the lower electrode layer; and a metal oxide thin film layer formed between the lower electrode layer and the upper electrode layer, the method comprising the steps of: forming the metal oxide thin film layer on the lower electrode layer; forming the upper electrode layer on the metal oxide thin film layer; and performing at least either one of a heat treatment and a plasma treatment on the metal oxide thin film layer in an oxygen-containing atmosphere to thereby form, in the metal oxide thin film layer, a first region whose value of resistance increases or decreases by an electric pulse that is applied between the lower electrode layer and the upper electrode layer and a second region arranged around the first region and having a larger content of oxygen than the first region.

The present invention provides a method of manufacturing a nonvolatile memory apparatus, the memory apparatus including a substrate; a plurality of first electrode wires formed in parallel with each other on the substrate; a plurality of second electrode wires formed above the plurality of first electrode wires so that the plurality of second electrode wires are in parallel with each other within a plane parallel to a principal surface of the substrate, and cross in three dimensions the plurality of first electrode wires; and a plurality of nonvolatile memory elements arrayed in a matrix to respectively correspond to three-dimensional cross points of the plurality of first electrode wires and the plurality of second electrode wires, wherein each of the plurality of nonvolatile memory elements comprises a lower electrode layer; an upper electrode layer formed above the lower electrode layer; and a metal oxide thin film layer formed between the lower electrode layer and the upper electrode layer, and wherein each of the plurality of first electrode wires and each of the plurality of second electrode wires in a cross region of each of the three-dimensional cross points constitute the lower electrode layer and the upper electrode layer, respectively, the method comprising the steps of forming the plurality of first electrode wires on the substrate; forming the metal oxide thin film layer on the plurality of first electrode wires; and performing, as an oxygen treatment, at least either one of a heat treatment and a plasma treatment on the metal oxide thin film layer in an oxygen-containing atmosphere to thereby form, in the metal oxide thin film layer, a first region whose value of resistance increases or decreases by an electric pulse that is applied between the lower electrode layer and the upper electrode layer and a second region arranged around the first region and having a larger content of oxygen than the first region.

In addition, in the step of carrying out the oxygen treatment of the nonvolatile memory apparatus manufacturing method in accordance with the present invention, it may be arranged such that at least either one of the heat treatment and the plasma treatment is performed utilizing as a mask a protective film formed on a surface of the metal oxide thin film layer in a cross region whereby the second region is formed in an outer peripheral region of the metal oxide thin film layer covered by the protective film.

In addition, in the step of carrying out the oxygen treatment of the nonvolatile memory apparatus manufacturing method in accordance with the present invention, it may be arranged such that at least either one of the heat treatment and the plasma treatment is performed utilizing as a mask a protective film formed on a surface of the metal oxide thin film layer in the cross region whereby the second region is formed in a portion of the metal oxide thin film layer except for the region covered by the protective film.

In addition, in the nonvolatile memory apparatus manufacturing method in accordance with the present invention, the protective film may be a connection electrode layer formed between the first region and the upper electrode layer.

In addition, the nonvolatile memory apparatus manufacturing method in accordance with the present invention may further include a step of forming in the substrate a semiconductor integrated circuit connected to the lower and upper electrode layers.

These objects as well as other objects, features and advantages of the present invention will become apparent to those skilled in the art from the following description with reference to the accompanying drawings.

EFFECT OF THE PRESENT INVENTION

In accordance with the nonvolatile memory elements and the nonvolatile memory apparatus of the present invention, the occurrence of crosstalk is suppressed even when miniaturized and in addition the sidewalls of a variable resistance layer are prevented from being damaged.

Figure 1A:
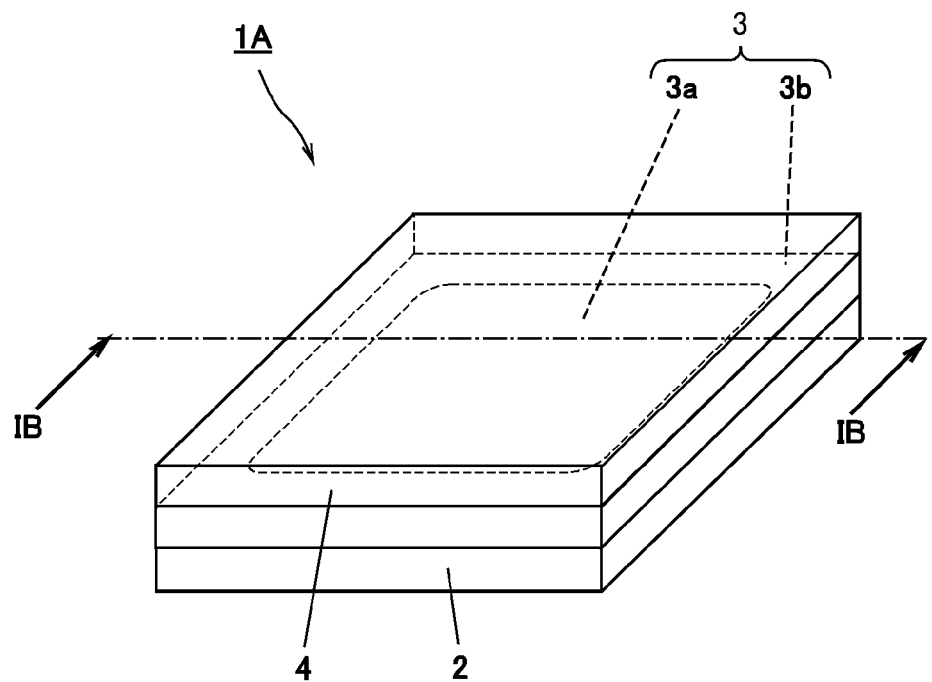
FIG. 1A is a perspective view illustrating schematically a structure of a principal part of a memory section in a nonvolatile memory element in accordance with a first embodiment of the present invention.

DESCRIPTION OF REFERENCE NUMERALS 1A, 1B, 1C, 10, 30, 40, 45 Nonvolatile memory element
2 Lower electrode layer
3, 12, 32, 52 Metal oxide resistance thin film layer
3$a$, 12$a$, 32$a$, 52$a$ First region
3$b$, 12$b$, 32$b$, 52$b$ Second region
4 Upper electrode layer
5, 15, 110, 230 Substrate 6 Conductor pattern
7, 16, 36, 56 Insulator layer
8 Wiring pattern
8a Contact
9, 104, 105 Resist film
11, 31, 51 First electrode wire
13, 33, 53 Second electrode wire
14, 34, 54 Connection electrode layer
19 Rectifier element
60 Semiconductor integrated circuit
100 Region
102, 107 Inner peripheral region
103, 108 Outer peripheral region
106 Cross region
120 Source region
130 Drain region
140 Gate insulating film
150 Gate electrode
160 Transistor
170, 240 Lower electrode
180 Resistance varying material layer
190, 260 Upper electrode
200 Nonvolatile memory section
210 Interlayer dielectric layer
220 Electrode wire
250 Active layer
270 Memory region

BEST MODE FOR CARRYING OUT THE INVENTION

Hereinafter, embodiments of the present invention will be described with reference to the accompanying drawings. Note that the same reference numerals are assigned to similar elements and their description is omitted in some cases. Also note that some part is shown in an enlarged manner for the sake of convenience.

First Embodiment

Structure of Nonvolatile Memory Element

Figure 1B:
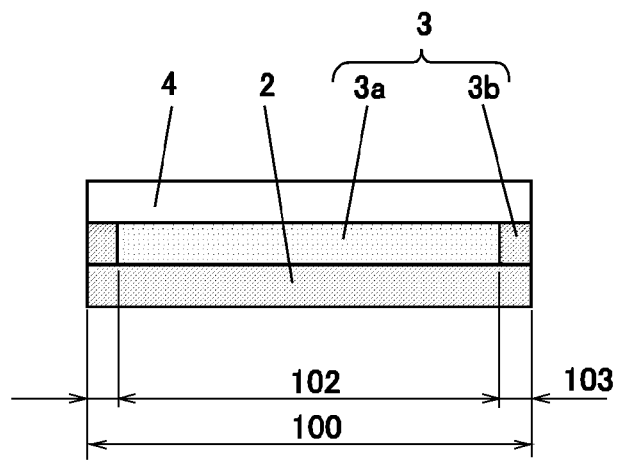
FIG. 1B is a cross-sectional view depicting a cross section taken along line IB-IB of FIG. 1A.

FIG. 1A is a perspective view illustrating schematically a structure of a principal part of a memory section in a nonvolatile memory element in accordance with a first embodiment of the present invention. FIG. 1B is a cross-sectional view depicting a cross section taken along line IB-IB of FIG. 1A. As shown in FIGS. 1A and 1B, a nonvolatile memory element 1A of the present invention includes a lower electrode layer 2 and an upper electrode layer 4 formed overlying the lower electrode layer 2. Formed between the lower electrode layer 2 and the upper electrode layer 4 is a metal oxide thin film layer 3.

The metal oxide thin film layer 3 is composed of a first region 3a and a second region 3b arranged so as to enclose the outer periphery of the first region 3a. In other words, the inner region of the metal oxide thin film layer 3 corresponds to the first region 3a and the outer peripheral region of the metal oxide thin film layer 3 corresponds to the second region 3b. Referring to FIG. 1B, of the entire metal oxide thin film layer 3 (i.e., the region represented by reference numeral 100), the region represented by reference numeral 102 is the first region 3a and the region represented by reference numeral 103 is the second region 3b. As will be described later, the first region 3a functions as a variable resistance layer whose value of resistance increases or decreases by an electric pulse that is applied between the lower electrode layer 2 and the upper electrode layer 4. In addition, the second region 3b is formed such that the content or the ratio of composition of oxygen of the second region 3b is higher than that of the first region 3a.

In addition, the second region 3b may be of such a structure that the content of oxygen grows gradiently towards the outer periphery from the region in abutment with the first region 3a.

The lower and upper electrode layers 2 and 4 and the first region 3a of the metal oxide thin film layer 3 are arranged as to overlap as viewed from the direction of the thickness of the first region 3a. In the example shown in FIGS. 1A and 1B, the entire first region 3a overlaps with the lower and upper electrode layers 2 and 4 in a planar view. However, the present invention is not limited to such a configuration. Therefore, it suffices if at least a part of the first region 3a overlaps with the lower and upper electrode layers 2 and 4 as viewed from the direction of the thickness of the first region 3a.

Figure 2A:
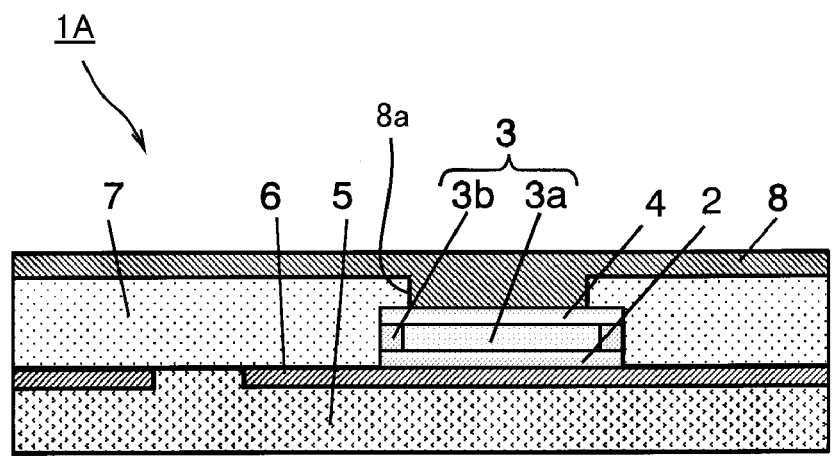
FIG. 2A is a cross-sectional view illustrating a concrete structure of the nonvolatile memory element in accordance with the first embodiment of the present invention.
Figure 2B:
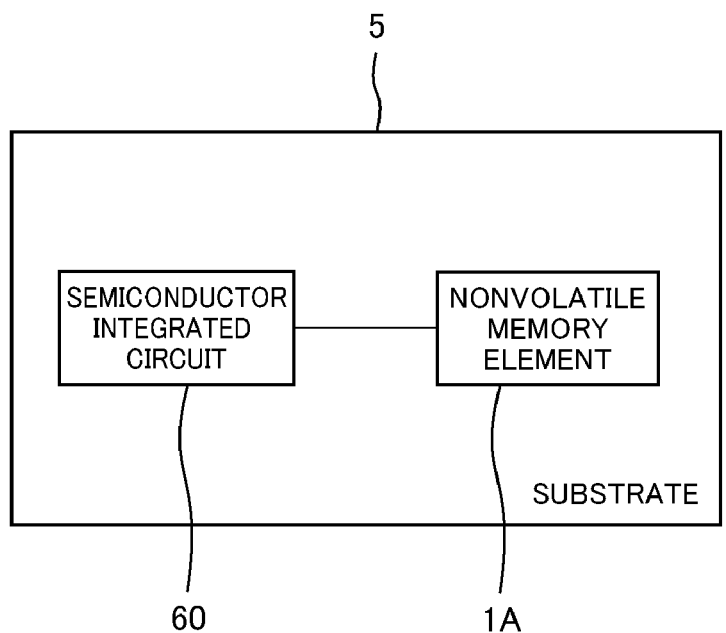
FIG. 2B is a top plan view illustrating schematically a concrete structure of the nonvolatile memory element in accordance with the first embodiment of the present invention.

FIG. 2A is a cross-sectional view illustrating a concrete structure of the nonvolatile memory element 1A in accordance with the first embodiment of the present invention. FIG. 2B is a top plan view illustrating schematically a structure of the nonvolatile memory element 1A. Note that although normally a large number of memory elements are formed on the substrate only one memory element is shown here for the sake of simplicity. In addition, with a view to facilitating understanding, some part thereof is shown in an enlarged manner.

As shown in FIG. 2A, the nonvolatile memory element 1A of the present embodiment is formed on a substrate 5, such as a silicon semiconductor, in which a semiconductor integrated circuit is formed. An wiring pattern 6 is formed on the substrate 5 and the lower electrode layer 2 is formed on the wiring pattern 6. The metal oxide thin film layer 3 is formed on the lower electrode layer 2 and the upper electrode layer 4 is formed on the metal oxide thin film layer 3. And, an insulator layer 7 is formed so as to cover the wiring pattern 6, the lower electrode layer 2, the metal oxide thin film layer 3, and the upper electrode layer 4.

An wiring pattern 8 is formed on top of the insulator layer 7. And, a contact 8a is formed to penetrate through the insulator layer 7 and the upper electrode layer 4 is connected to the wiring pattern 8 by the contact 8a.

The metal oxide thin film layer 3 is made up of the first region 3a and the second region 3b arranged so as to enclose the outer peripheral of the first region 3a and having a larger content of oxygen than the first region 3a. Here, the first region 3a is formed of a variable resistance layer whose value of resistance increases or decreases by an electric pulse that is applied between the lower electrode layer 2 and the upper electrode layer 4.

In addition, the second region 3b may be of such a structure that the content of oxygen thereof grows gradiently towards the outer periphery from the region in abutment with the first region 3a.

In addition, the metal oxide thin film layer 3 is formed of a transition metal oxide material (more specifically, a thin film of iron oxide) and the first region 3a is formed of triiron tetroxide ($Fe_3O_4$). Additionally, the first region 3a can be formed of materials such as transition metal oxide materials (e.g. $NiO_x$ or $TiO_x$) whose value of resistance increases as the amount of oxygen, x, increases.

As shown in FIG. 2B, the semiconductor integrated circuit 60 and the nonvolatile memory element 1A which are formed in the substrate 5 are electrically connected together. More specifically, the semiconductor integrated circuit 60 and the lower and upper electrode layers 2 and 4 of the nonvolatile memory element 1A are electrically connected together.

Operation of Nonvolatile Memory Element

Next, the operation of the nonvolatile memory element 1A configured as above will be described.

In the nonvolatile memory element 1A, a first predetermined electric pulse (either a current pulse or a voltage pulse) is applied between the lower electrode layer 2 and the upper electrode layer 4. In this case, this electric pulse is applied to the first region 3a of the metal oxide thin film layer 3 arranged between the lower electrode layer 2 and the upper electrode layer 4. Because of this, the first region 3a of the metal oxide thin film layer 3 is placed in a state of having a first predetermined resistance value and maintains this state. And, if, in this state, a second predetermined electric pulse is applied between the lower electrode layer 2 and the upper electrode layer 4, then the first region 3a of the metal oxide thin film layer 3 is placed in a state of having a second predetermined resistance value and maintains this state.

Here, the first predetermined resistance value and the second predetermined resistance value are made to correspond to, for example, two different binary data values, respectively. As a result, it becomes possible to write binary data to the nonvolatile memory element 1A by the application of either the first predetermined electric pulse or the second predetermined electric pulse to the first region 3a of the metal oxide thin film layer 3. In addition, by supplying to the nonvolatile memory element 1A a voltage or current that does not cause the resistance value of the first region 3a of the metal oxide thin film layer 3 to be changed and then detecting the resistance value thereof, it becomes possible to read the binary data which has been written to the nonvolatile memory element 1A.

In this way, the first region 3a of the metal oxide thin film layer 3 arranged between the lower electrode layer 2 and the upper electrode layer 4 functions as a memory section.

In the present invention, as described above, in the metal oxide thin film layer 3 the second region 3b has a larger content of oxygen as compared to the first region 3a. Therefore, the resistance value of the second region 3b is higher than the resistance value of the first region 3a. In this way, the second region 3b of higher resistance value is used to enclose the outer periphery of the first region 3a whereby crosstalk is suppressed and in addition the sidewalls of the metal oxide thin film layer 3 are prevented from being damaged. Consequently, it becomes possible to realize a nonvolatile memory element capable of preventing degradation in the electric characteristics.

Method of Manufacturing Nonvolatile Memory Element

Next, a method of manufacture of the nonvolatile memory element 1A will be described.

FIGS. 3A through 3E are cross-sectional views illustrating steps in the method of manufacture of the nonvolatile memory element 1A in accordance with the first embodiment of the present invention.

Figure 3A:
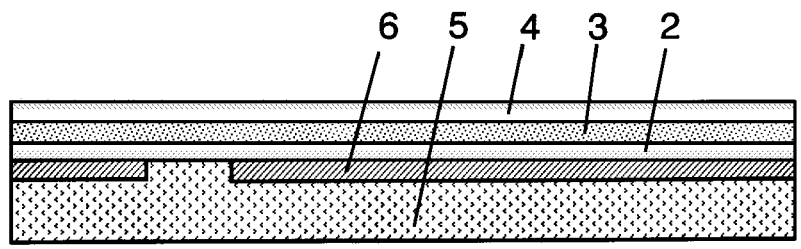
FIG. 3A is a cross-sectional view illustrating a step in a method of manufacturing the nonvolatile memory element in accordance with the first embodiment of the present invention.

In the step shown in FIG. 3A, the lower electrode layer 2, the metal oxide thin film layer 3, and the upper electrode layer 4 are formed sequentially in that order on the substrate 5 with the predetermined wiring pattern 6 formed therein. In addition, here, the terms "lower electrode layer 2", "metal oxide thin film layer 3", and "upper electrode layer 4" refer to not only those which have been etched in a predetermined pattern shape but also those which have been formed into films.

As the material to form the lower and upper electrode layers 2 and 4, electrode materials for use in semiconductor elements or conventional nonvolatile memory elements, such as aluminum (Al), copper (Cu), platinum (Pt) et cetera, can be employed. In addition, as the material to form the metal oxide thin film layer 3, transition metal oxide materials can be employed. More specifically, transition metal oxides such as triiron tetroxide ($Fe_3O_4$), titanium oxide ($TiO_x$), nickel oxide ($NiO_x$) et cetera can be employed. In addition, other transition metal oxides whose value of resistance increases as the amount of oxygen with respect to the metal increases can be employed.

Figure 3B:
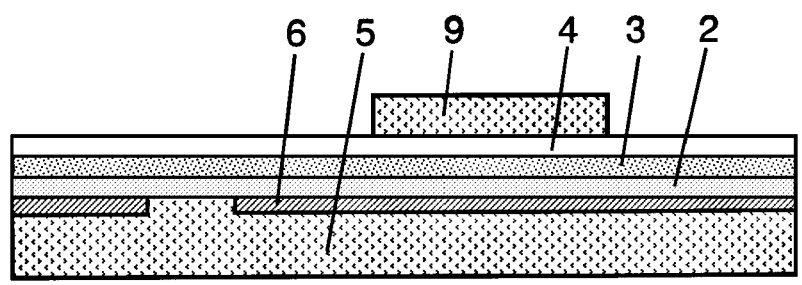
FIG. 3B is a cross-sectional view illustrating a step in the nonvolatile memory element manufacturing method in accordance with the first embodiment of the present invention.

Next, in the step shown in FIG. 3B, a resist film 9 having a predetermined pattern shape is formed by means of a general exposure process and a general development process in order to make a memory section.

Figure 3C:
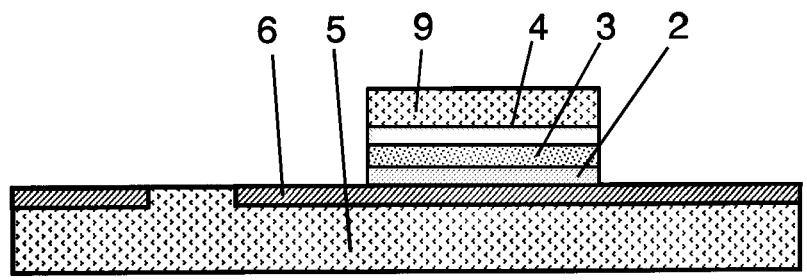
FIG. 3C is a cross-sectional view illustrating a step in the nonvolatile memory element manufacturing method in accordance with the first embodiment of the present invention.

Next, in the step shown in FIG. 3C, the upper electrode layer 4, the metal oxide resistance thin film layer 3, and the lower electrode layer 2 are each etched. This forms a memory section having such a construction that the metal oxide thin film layer 3 is sandwiched between the lower electrode layer 2 and the upper electrode layer 4.

Figure 3D:
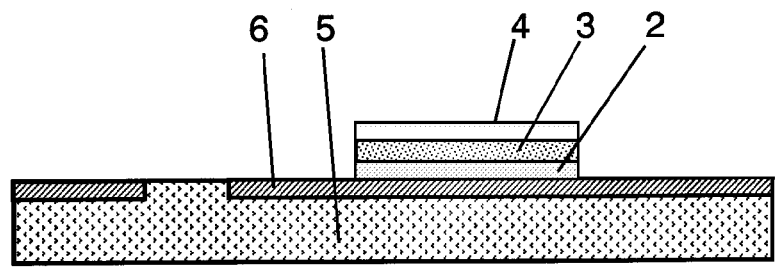
FIG. 3D is a cross-sectional view illustrating a step in the nonvolatile memory element manufacturing method in accordance with the first embodiment of the present invention.

Next, in the step shown in FIG. 3D, the resist film 9 is removed away. Thereafter, the insulator layer 7 will be formed. However, prior to the formation of the insulator layer 7, a plasma treatment is carried out in an oxidation atmosphere whereby active oxygen, oxygen ions, or oxygen atoms are diffused into the metal oxide thin film layer 3 through the sidewalls thereof, and join together within the outer peripheral region of the metal oxide thin film layer 3 or are taken thereinto. As a result of this, the outer peripheral region of the metal oxide thin film layer 3 is higher in the content or the ratio of composition of oxygen when compared to the internal region remaining in the same state as when the metal oxide thin film layer 3 was formed. The internal and external regions of the metal oxide thin film layer 3 at this time point become, respectively, the first region 3a and the second region 3b.

In addition, in the present embodiment, the second region 3b is formed prior to the formation of the insulator layer 7, as described above; however, the second region 3b may be formed by an oxygen-atmosphere plasma when forming the insulator layer 7.

In the aforesaid step of forming the second region 3b, a plasma treatment is carried out in an atmosphere of oxidation; however, the present invention is not limited to this. It suffices if at least either one of a heat treatment and a plasma treatment is carried out in an oxygen-containing atmosphere. The step of performing such a heat or plasma treatment is hereinafter referred to as an oxygen treatment process.

Figure 3E:
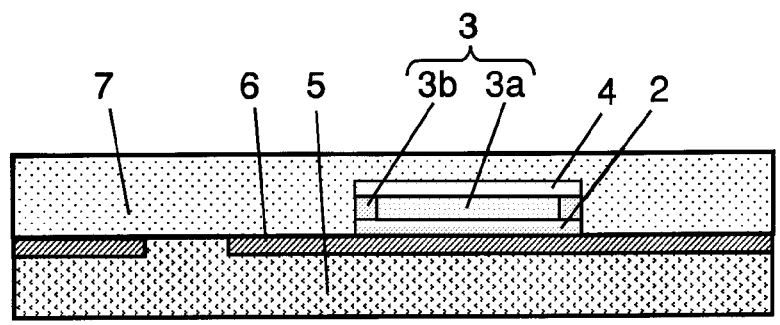
FIG. 3E is a cross-sectional view illustrating a step in the nonvolatile memory element manufacturing method in accordance with the first embodiment of the present invention.

Thereafter, in the step shown in FIG. 3E, the insulator layer 7 is formed with which the wiring pattern 6, the lower electrode layer 2, the metal oxide thin film layer 3, and the upper electrode layer 4 are all covered.

Figure 3F:
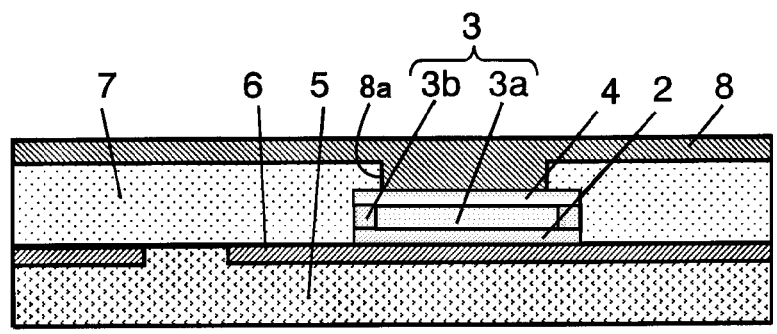
FIG. 3F is a cross-sectional view illustrating a step in the nonvolatile memory element manufacturing method in accordance with the first embodiment of the present invention.

Then, in the step shown in FIG. 3F, a contact hole is formed extending from the surface of the insulator layer 7 to the upper electrode layer 4 by etching utilizing a photolithography technique. Thereafter, by sputtering and photolithography, the wiring pattern 8 is formed in a specified portion on the surface of the insulator layer 7 so as to fill up the contact hole. As a result, the wiring pattern 8, connected to the upper electrode layer 4 by a contact 8a with which the contact hole is filled up, is formed.

The wiring patterns 6 and 8 thus formed and the semiconductor integrated circuit formed in the substrate 5 are electrically connected together. Therefore, the semiconductor integrated circuit and the lower and upper electrode layers 2 and 4 of the nonvolatile memory element 1A are electrically connected together. Note that the process of forming the semiconductor integrated circuit is the same as conventional ones.

In the way as described above, the nonvolatile memory element 1A shown in FIGS. 2A and 2B is fabricated. It is possible that the nonvolatile memory element 1A is used to fabricate a nonvolatile memory element having, for example, a one-transistor/one-nonvolatile memory section structure.

By the employment of the above configuration, it becomes possible to prevent the occurrence of damage to the sidewalls of the metal oxide thin film layer 3, thereby making it possible to prevent electric degradation. In addition, it is possible to prevent a short circuit failure between the lower electrode layer 2 and the upper electrode layer 4 whereby the nonvolatile memory element 1A with good reproducibility and stable characteristics is obtained. In addition, for the case of the present embodiment, the process used in manufacturing a memory section of a conventional nonvolatile memory element can be applied without substantial change, thereby making it possible to stably provide a higher-performance, inexpensive nonvolatile memory element.

In addition, if, in the case where $Fe_3O_4$ is used as the first region 3a, a heat treatment is carried out in oxygen at a substrate temperature of 400 degrees Centigrade for one minute in the oxidation treatment process, then the second region 3b of $Fe_2O_3$ is formed. In this case, the ratio of oxygen to the metal (O/Fe) is 1.33 for the case of the first region 3a and 1.5 for the case of the second region 3b. In addition, in this case, the spread width of the second region 3b (the width of a region 103 in FIG. 1B) ranges between about 30 to about 150 nm from the electrode end of the upper electrode layer 4. This is the range within which the spread width of the second region 3b is allowed to vary, in the case of the first embodiment where the upper electrode layer 4 and the metal oxide thin film layer 3 have the same width. Here, for example, if the width of the upper electrode layer 4 is greater than the width of the metal oxide thin film layer 3, then the spread width of the second region 3b is allowed to vary within the range between about 30 and about 150 nm from the end of the metal oxide thin film layer 3.

Structure of Nonvolatile Memory Element of First Modification

Figure 4A:
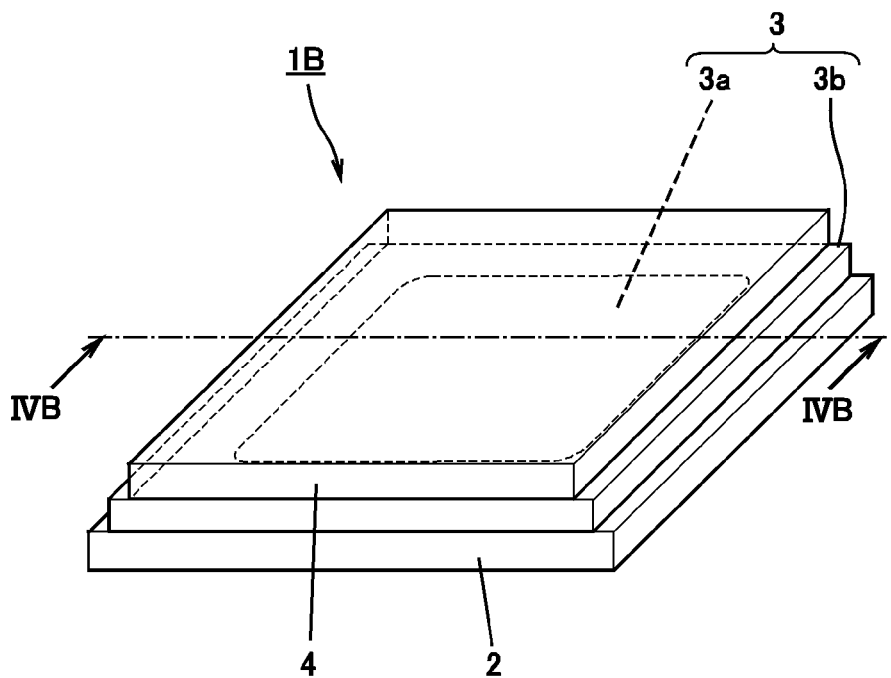
FIG. 4A is a perspective view illustrating schematically a structure of a principal part of a memory section in a nonvolatile memory element in accordance with a first modification of the first embodiment of the present invention.
Figure 4B:
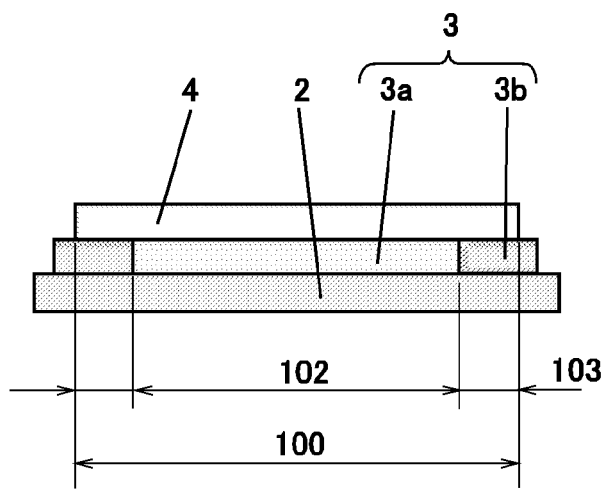
FIG. 4B is a cross-sectional view depicting a cross section taken along line IVB-IVB of FIG. 4A.

FIG. 4A is a perspective view illustrating schematically a structure of a principal part of a memory section of a nonvolatile memory element in accordance with a first modification of the present embodiment. FIG. 4B is a cross-sectional view depicting a cross section taken along line IVB-IVB of FIG. 4A. In addition, FIG. 5 is a cross-sectional view illustrating a concrete structure of the nonvolatile memory element 1A in accordance with the first modification.

Figure 5:
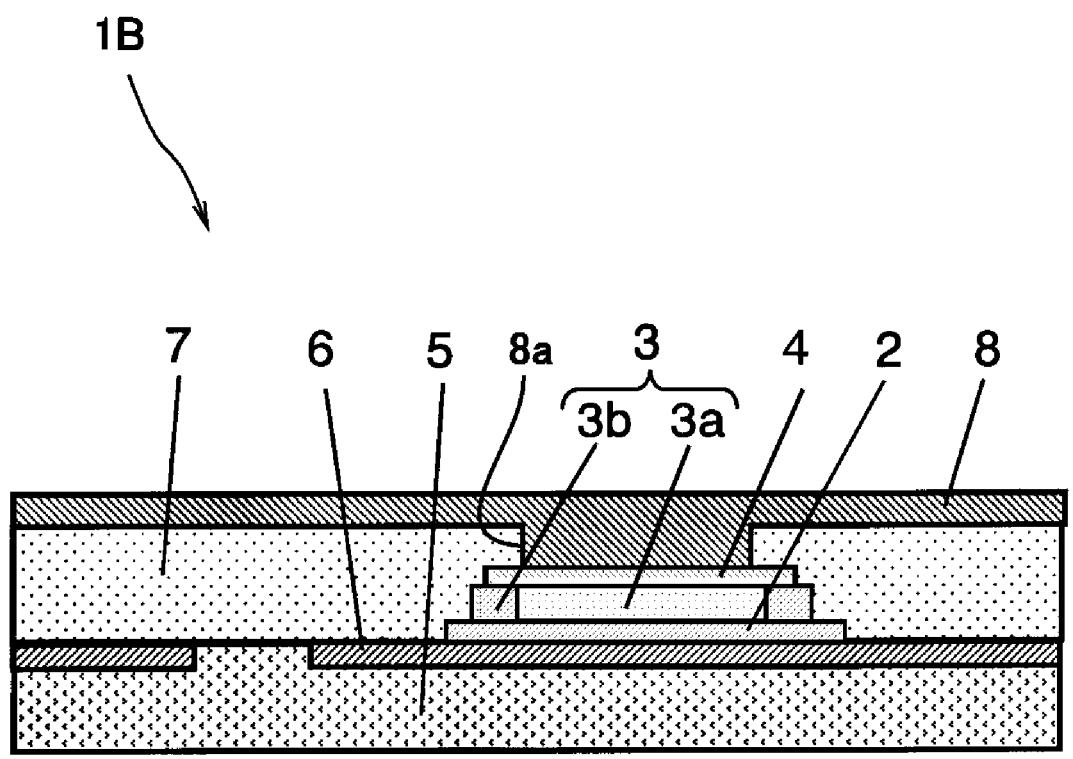
FIG. 5 is a cross-sectional view illustrating a concrete structure of the nonvolatile memory element in accordance with the first modification of the first embodiment of the present invention.

As shown in FIGS. 4A, 4B, and 5, for the case of the nonvolatile memory element 1B of the first modification, the contour shape in plan view becomes greater in size in the sequential order of the upper electrode layer 4, the metal oxide thin film layer 3, and the lower electrode layer 2. Therefore, as shown in FIG. 4B, the side regions of the nonvolatile memory element 1B are step shaped.

In addition, since the other structures of the nonvolatile memory element 1B are the same as in the nonvolatile memory element 1A, the same reference numerals are assigned to them as their counterparts of the nonvolatile memory element 1A, the description of which is omitted accordingly.

The method of manufacture of the nonvolatile memory element 1B having the aforesaid shape is the same as the method of manufacture of the nonvolatile memory element 1A except for the following difference. The difference from the method of manufacture of the nonvolatile memory element 1A is that in the etching step shown in FIG. 3C, after the formation of the metal oxide resistance thin film layer 3 it is etched to a predetermined pattern shape and thereafter the upper electrode layer 4 is formed and then etched to a predetermined pattern shape. In this case, as the materials to form the upper electrode layer 4, the metal oxide thin film layer 3, and the lower electrode layer 2, materials etchable, respectively, in different etching conditions should preferably be selected.

In addition, the oxygen treatment process is carried out after the formation of the upper electrode layer 4 but prior to the formation of the insulator layer 7, which is the same as in the case of the nonvolatile memory element 1A of the present embodiment.

Also in the nonvolatile memory element 1B in accordance with the first modification, the same effects as those accomplished in the case of the nonvolatile memory element 1A, such as the prevention of electric degradation et cetera, are accomplished.

Structure of Nonvolatile Memory Element of Second Variation

Figure 6A:
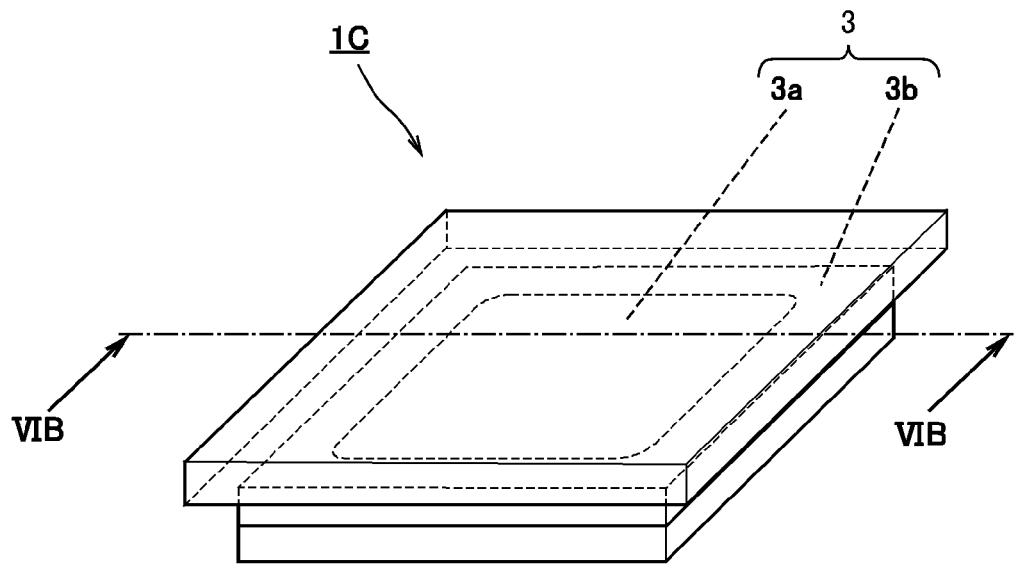
FIG. 6A is a perspective view illustrating schematically a structure of a principal part of a memory section in a nonvolatile memory element in accordance with a second modification of the first embodiment of the present invention.
Figure 6B:
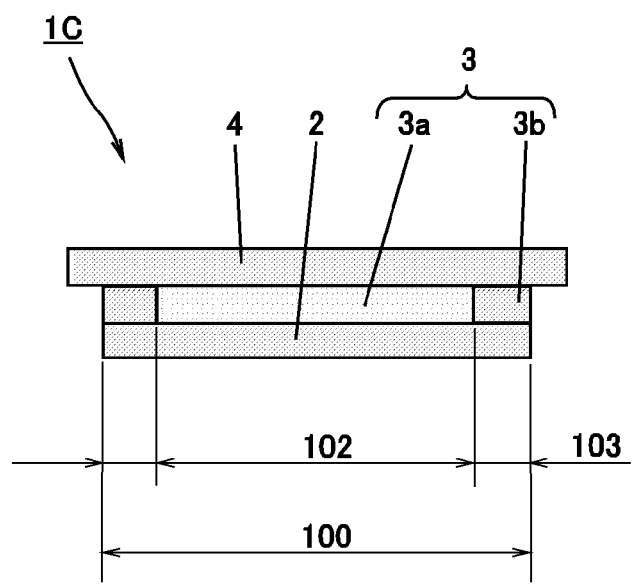
FIG. 6B is a cross-sectional view depicting a cross section taken along line VIB-VIB of FIG. 6A.

FIG. 6A is a perspective view illustrating schematically a structure of a principal part of a memory section of a nonvolatile memory element in accordance with a second modification of the present embodiment. FIG. 6B is a cross-sectional view depicting a cross section taken along line VIB-VIB of FIG. 6A. In addition, FIG. 7 is a cross-sectional view illustrating a concrete structure of the nonvolatile memory element in accordance with the second modification.

Figure 7:
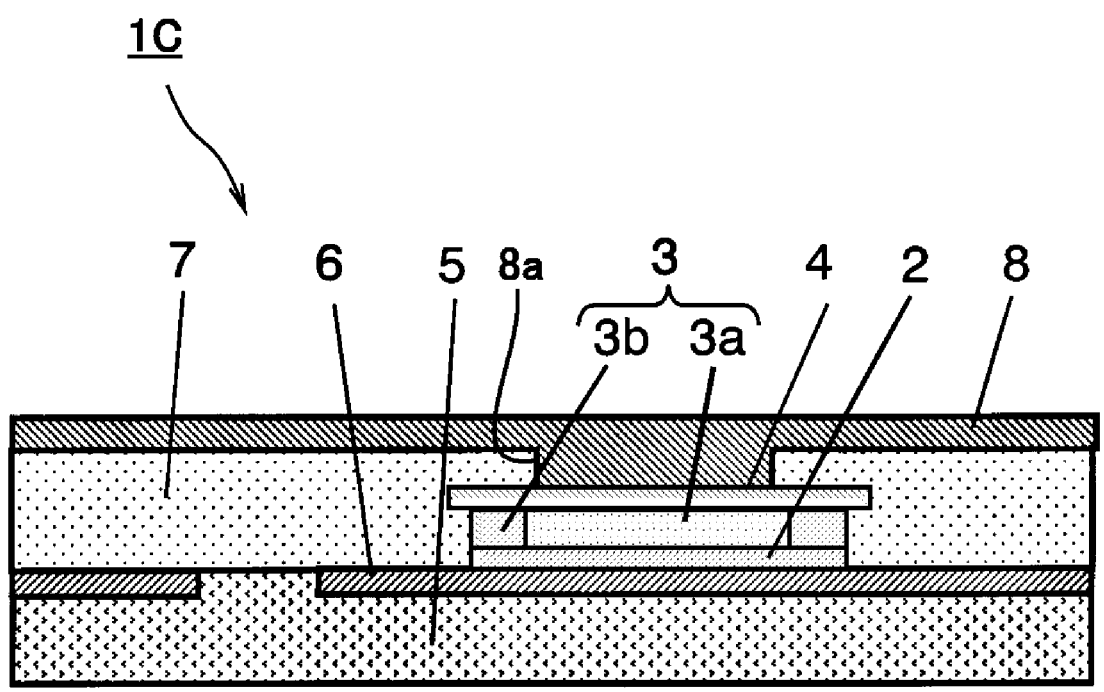
FIG. 7 is a cross-sectional view illustrating a concrete structure of the nonvolatile memory element in accordance with the second modification of the first embodiment of the present invention.

As shown in FIGS. 6A, 6B, and 7, for the case of the nonvolatile memory element 1C of the second modification, the metal oxide thin film layer 3 and the lower electrode layer 2 are identical in their contour shape in plan view with each other while on the other hand the upper electrode layer 4 has a larger contour shape in plan view than the metal oxide thin film layer 3 and the lower electrode layer 2.

In addition, since the other structures of the nonvolatile memory element 1C are the same as in the nonvolatile memory element 1A, the same reference numerals are assigned to them as their counterparts of the nonvolatile memory element 1A, the description of which is omitted accordingly.

The method of manufacture of the nonvolatile memory element 1C having the aforesaid shape is the same as the method of manufacture of the nonvolatile memory element 1A except for the following difference. The difference from the method of manufacture of the nonvolatile memory element 1A is that in the etching step shown in FIG. 3C, for example, after the formation of the lower electrode layer 2 and the metal oxide thin film layer 3 they are etched to predetermined pattern shapes and thereafter the upper electrode layer 4 is formed and then etched to a predetermined pattern shape. In this case, the oxygen treatment process is carried out in the same way as in the method of manufacture of the nonvolatile memory element 1A whereby the second region 3b is formed.

Also in the nonvolatile memory element 1C in accordance with the second modification, the same effects as those accomplished in the case of the nonvolatile memory element 1A, such as the prevention of electric degradation et cetera, are accomplished.

In addition, it should be noted that the contour shapes in plan view of the lower electrode layer 2, the metal oxide thin film layer 3, and the upper electrode layer 4 of the nonvolatile memory element of the present embodiment are not limited to the above-described ones. Therefore, all of these contour shapes may be identical with each other, may be different from one another, or may be that at least one of the contour shapes differs from the rest.

Second Embodiment

A nonvolatile memory apparatus in accordance with a second embodiment is of a so-called cross point type in which an active layer is interposed at the cross point (cross point in three dimensions) of a word line and a bit line.

Structure of Nonvolatile Memory Apparatus

Figure 8A:
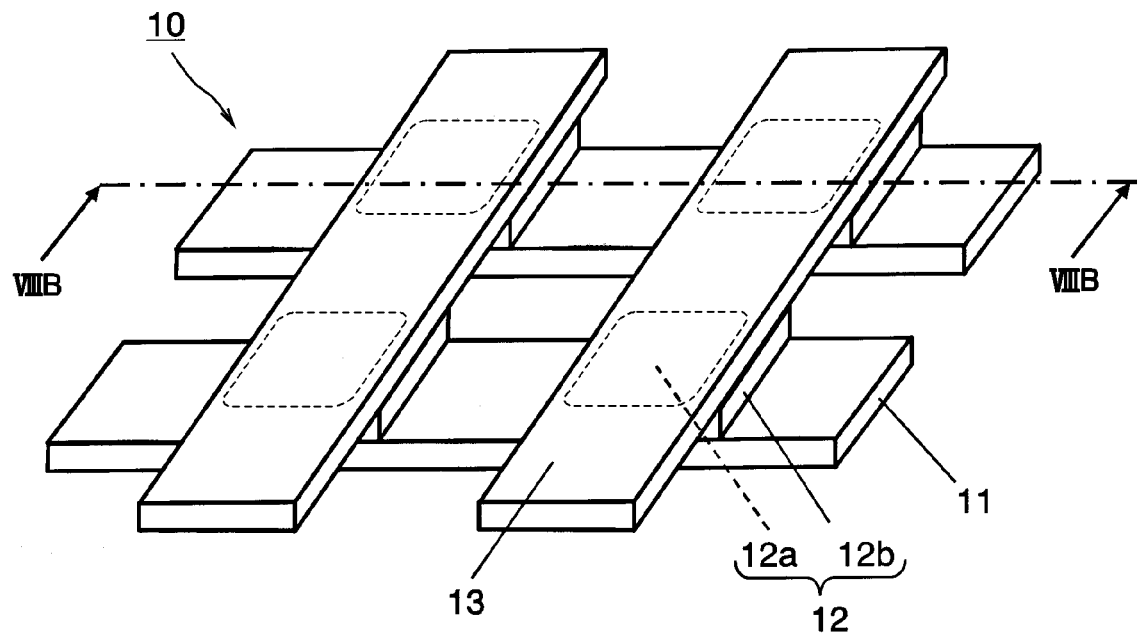
FIG. 8A is a perspective view illustrating schematically a structure of a principal part of a nonvolatile memory apparatus in accordance with a second embodiment of the present invention.
Figure 8B:
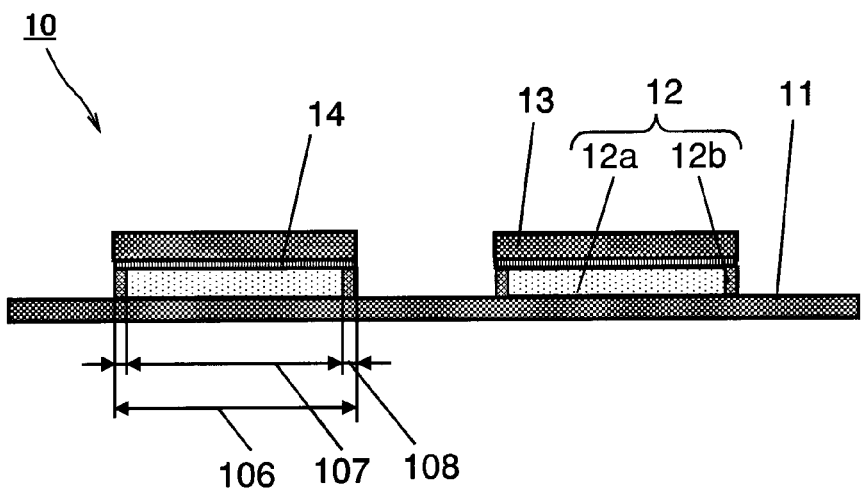
FIG. 8B is a cross-sectional view depicting a cross section taken along line VIIIB-VIIIB of FIG. 8A.

FIG. 8A is a perspective view illustrating schematically a structure of a principal part in the nonvolatile memory apparatus in accordance with the second embodiment of the present invention. FIG. 8B is a cross-sectional view depicting a cross section taken along line VIIIB-VIIIB of FIG. 8A. In addition, for the sake of convenience, the structural representation of the substrate, the interlayer dielectric layer and so on is omitted in part in FIGS. 8A and 8B.

As shown in FIGS. 8A and 8B, in the nonvolatile memory apparatus 10 of the present embodiment, a plurality of first electrode wires 11 are formed on a substrate (not shown). Each of the plurality of first electrode wires 11 is shaped like an elongated rectangle (like a strip having a constant width and a predetermined length) and is formed in parallel with the others within a first plane (not shown) parallel to a principal surface of the substrate. In addition, a plurality of second electrode wires 13 are formed over the substrate. Each of the plurality of second electrode wires 13 is shaped like an elongated rectangle (like a strip having a constant width and a predetermined length) and is formed in parallel with the others within a second plane (not shown) overlying and substantially parallel to the first plane. Therefore, the plurality of first electrode wires 11 and the plurality of second electrode wires 13 are orthogonal to one another in plan view, in other words the first and second electrode wires 11 and 13 cross over one another three-dimensionally at right angles. A metal oxide thin film layer 12 is arranged in each of the cross regions of the plurality of first electrode wires 11 and the plurality of second electrode wires 13. Consequently, a memory cell is formed at each of the three-dimensional cross points of the plurality of first electrode wires 11 and the plurality of second electrode wires 13.

In addition, in the present embodiment, the portion of the first electrode wire 11 and the portion of the second electrode wire 13 in the cross region (represented by reference numeral 106 in FIG. 8A) of the first electrode wire 11 and the second electrode wire 13 constitute, respectively, a lower electrode layer and an upper electrode layer.

Each metal oxide thin film layer 12, provided in the cross region of the first electrode wire 11 and the second electrode wire 13, is composed of a first region 12a and a second region 12b formed so as to enclose the outer periphery of the first region 12a. Stated another way, the internal region of the metal oxide thin film layer 12 corresponds to the first region 12a and the outer peripheral region corresponds to the second region 12b. Referring to FIG. 8B, of the entire metal oxide thin film layer 12, the region denoted by reference numeral 107 is the first region 12a and the region denoted by reference numeral 108 is the second region 12b. The first region 12a functions as a variable resistance layer whose value of resistance increases or decreases by an electric pulse that is applied between the lower electrode layer and the upper electrode layer. In addition, the second region 12b is formed such that its content or the ratio of composition of oxygen is larger than the first region 12a.

In addition, the second region 12b may be of such a structure that the content of oxygen thereof grows gradiently towards the outer periphery from the region in abutment with the first region 12a.

As shown in FIG. 8B, a connection electrode layer 14 connected to the second electrode wire 13 is formed on the metal oxide thin film layer 12 (note that representation of the connection electrode layer is omitted in FIG. 8A). The metal oxide thin film layer 12 is electrically connected via the connection electrode layer 14 to the second electrode wire 13.

The lower electrode layer (the portion of the first electrode wire 11 in the cross region 106) and the upper electrode layer (the portion of the second electrode wire 13 in the cross region 106), and the first region 12a of the metal oxide thin film layer 12 are arranged such that they overlap as viewed from the direction of the thickness of the first region 12a. In the example shown in FIGS. 8A and 8B, the entire first region 12a overlaps in plan view with the lower and upper electrode layers. However, the present invention is not limited to such a configuration, and it suffices if at least a part of the first region 12a overlaps with the lower and upper electrode layers as viewed from the direction of the thickness of the first region 12a.

In addition, one of the first electrode wire 11 and the second electrode wire 13 functions as a word line and the other electrode wire functions as a bit line.

As described above, the resistance value of the first region 12a functioning as a variable resistance layer increases or decreases by the application of an electric pulse. The writing-in or the reading-out of information is carried out by such a variation in the resistance value. The outer peripheral region of the second region 12b has a resistance value substantially approximate to that of the insulator. This therefore prevents such a phenomenon that the first electrode wire 11 and the second electrode wire 13 are short circuited through the sidewall of the metal oxide thin film layer 12 and also prevents the occurrence of damage to the sidewalls of the metal oxide thin film layer 12.

Figure 8C:
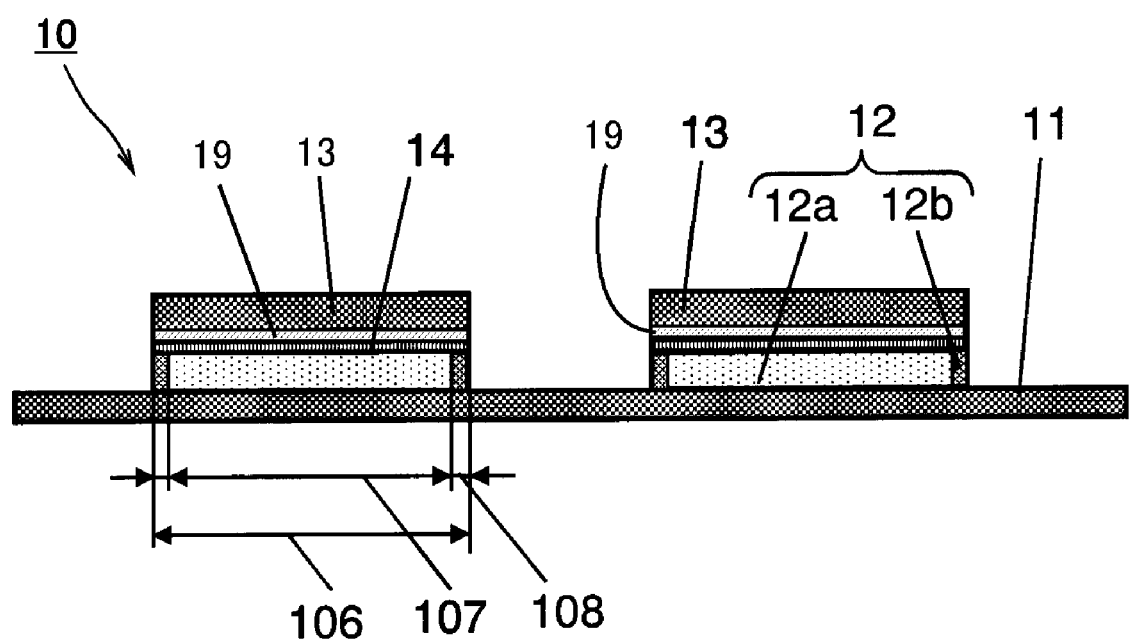
FIG. 8C is a cross-sectional view illustrating schematically a structure of a principal part of the nonvolatile memory apparatus in accordance with a modification of the second embodiment of the present invention.

In addition, as shown in FIG. 8C, a rectifier element 19 may be arranged between the connection electrode layer 14 and the second electrode wire 13 (upper electrode layer) in the cross region of the first electrode wire 11 and the second electrode wire 13.

In the structure shown in FIG. 8, the rectifier element 19 is arranged between the connection electrode layer 14 and the upper electrode layer. However, where to arrange the rectifier element 19 is not limited to such a position. That is, it suffices if connected electrically either to the lower electrode layer or to the upper electrode layer.

In addition, when using an MSM diode as the rectifier element 19, the rectifier element 19 can be formed by sequential deposition of metal-semiconductor-metal in that order. In this case, as the semiconductor material, for example, a film of nitrogen-deficient silicon nitride ($SiN_x$) may be used, which should of course not be deemed restrictive. In addition, when using an MIM diode as the rectifier element 19, the rectifier element 19 can be formed by sequential deposition of metal-insulator-metal in that order.

As described above, the provision of the rectifier element makes it possible to avoid write errors and read errors and in addition to obtain a higher-performance, stable nonvolatile memory element.

Method of Manufacturing Nonvolatile Memory Apparatus

Next, a method of manufacture of the nonvolatile memory apparatus 10 will be described.

FIGS. 9A through 9D, FIGS. 10A through 10D, and FIGS. 11A and 11B are views illustrating steps of the method of manufacture of the nonvolatile memory apparatus 10 in accordance with the second embodiment of the present invention. FIGS. 9A and 9C, FIGS. 10A and 10C, and FIG. 11A are top plan views illustrating a principal part of the nonvolatile memory apparatus 10. FIGS. 9B and 9D, FIGS. 10B and 10D, and FIG. 11B are cross-sectional views taken along the first electrode wire 11.

In addition, although in fact a large number of the first electrode wires 11 and a large number of the second electrode wires 13 are formed in the nonvolatile memory apparatus 10 and the metal oxide thin film layer 12 is formed in each of the cross regions of the first electrode wires 11 and the second electrode wires 13, FIGS. 9A through 9D, FIGS. 10A through 10D, and FIGS. 11A and 11B show the nonvolatile memory apparatus 10 that is provided with three first electrode wires 11 and three second electrode wires 13. In addition, in order to facilitate understanding, some part is shown in an enlarged manner.

Figure 9A:
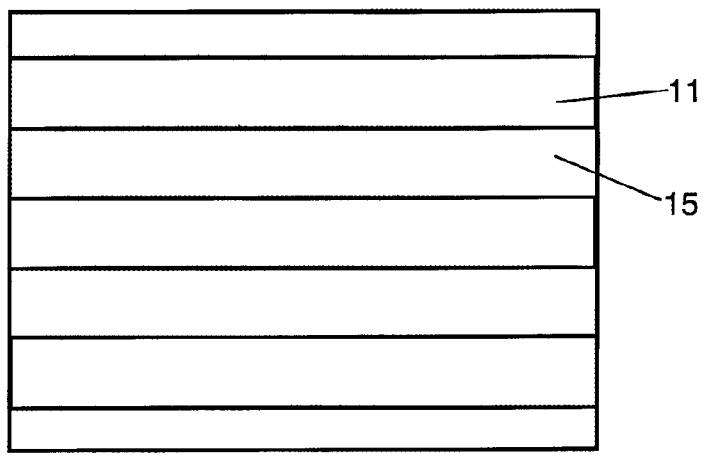
FIG. 9A is a top plan view illustrating a step in a method of manufacturing the nonvolatile memory apparatus in accordance with the second embodiment of the present invention.
Figure 9B:
FIG. 9B is a cross-sectional view illustrating a step in the nonvolatile memory apparatus manufacturing method in accordance with the second embodiment of the present invention.

In the step shown in FIGS. 9A and 9B, the first electrode wire 11 is formed on a substrate 15 having on top thereof at least an insulating layer. As the material to form the first electrode wire 11, materials for use in semiconductor elements or in conventional nonvolatile memory elements such as aluminum (Al), copper (Cu), platinum (Pt) et cetera can be employed. The first electrode wire 11 is formed by a photolithography process and an etching process into an elongated rectangle shape. Also note that hereinafter the term "first electrode wire 11" refers to not only when formed into an elongated rectangle shape but also when film-formed.

Figure 9C:
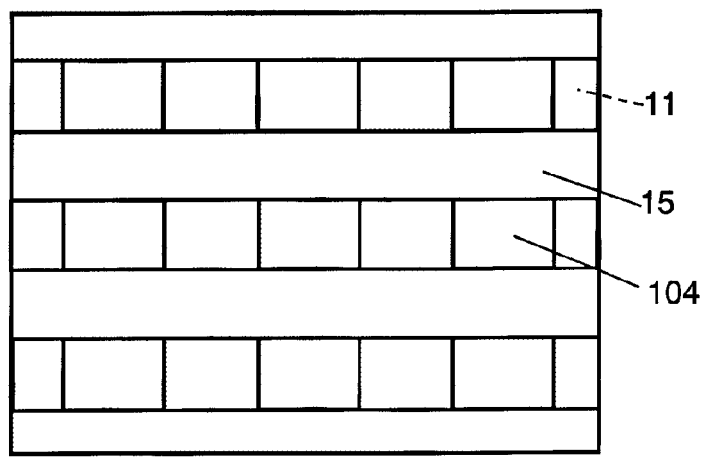
FIG. 9C is a top plan view illustrating a step in the nonvolatile memory apparatus manufacturing method in accordance with the second embodiment of the present invention.
Figure 9D:
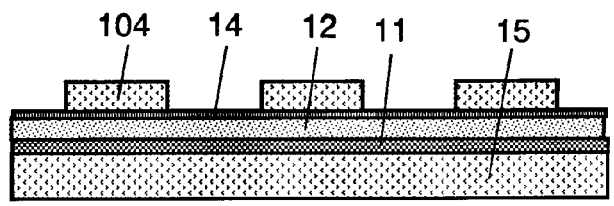
FIG. 9D is a cross-sectional view illustrating a step in the nonvolatile memory apparatus manufacturing method in accordance with the second embodiment of the present invention.

Next, in the step shown in FIGS. 9C and 9D, the metal oxide thin film layer 12 whose value of resistance varies reversibly by an electric pulse is formed. As the material to form the metal oxide thin film layer 12, transition metal oxide materials (more specifically, a film of iron oxide) can be used and the first region 3a is triiron tetroxide ($Fe_3O_4$). Additionally, as the material to form the first region 3a, materials such as a transition metal oxide material (e.g., $NiO_x$ or $TiO_x$) whose value of resistance increases as the amount of oxygen, x, increases can be used. Also note that hereinafter, the term "metal oxide thin film layer 12" refers to not only when etched to a predetermined pattern shape but also when film-formed.

The connection electrode layer 14 is formed on the oxide resistance thin film layer 12. Although the term "connection electrode layer 14" refers to when etched to a predetermined pattern shape, it also includes the state when film-formed. The connection electrode layer 14 may be formed of the same material as used to form the first electrode wire 11 and the second electrode wire 13 (formed later) or of a different material. It is, however, required to use materials that will not undergo deterioration (e.g., oxidation) at least in an atmosphere of an oxidation treatment performed with respect to the metal oxide thin film layer 12. In addition, it is also required to use materials having superior blocking properties against oxygen gas, oxygen atom et cetera. Accordingly, for example, the connection electrode layer 14 may be of a laminated structure of an electrode layer having superior oxygen barrier properties and an electrode layer free from oxidation.

Furthermore, in order to process the metal oxide thin film layer 12 into a predetermined pattern shape, a resist film 104 is formed. The resist film 104 is formed in the cross region where the first electrode wire 11 and the second electrode wire 13 (formed in the subsequent step) cross each other.

Figure 10A:
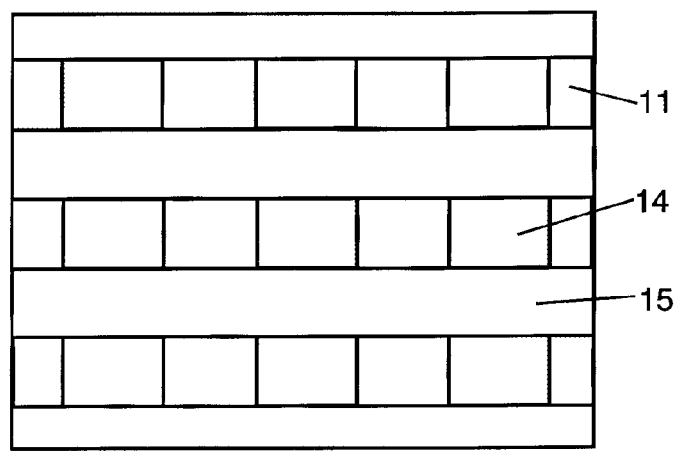
FIG. 10A is a top plan view illustrating a step in the nonvolatile memory apparatus manufacturing method in accordance with the second embodiment of the present invention.
Figure 10B:
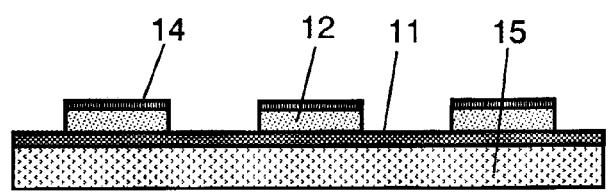
FIG. 10B is a cross-sectional view illustrating a step in the nonvolatile memory apparatus manufacturing method in accordance with the second embodiment of the present invention.

Next, in the step shown in FIGS. 10A and 10B, etching is carried out utilizing the resist film 104 as a mask such that only the connection electrode layer 14 and the metal oxide resistance thin film layer 12 in the cross region of the first electrode wire 11 and the second electrode wire 13 (formed subsequently) remain while the rest is etched away. This etching can be carried out by commonly-used dry etching techniques. The resist film 104 is removed away after the completion of the etching. Alternatively, it may be arranged such that the resist film 104 is removed after etching the connection electrode layer 14, and the metal oxide resistance thin film layer 12 is etched utilizing the connection electrode layer 14 as a mask.

Figure 10C:
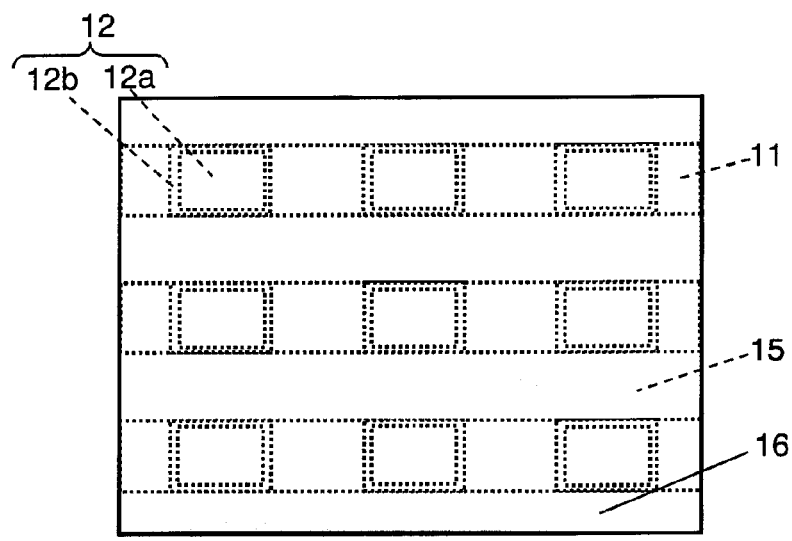
FIG. 10C is a top plan view illustrating a step in the nonvolatile memory apparatus manufacturing method in accordance with the second embodiment of the present invention.
Figure 10D:
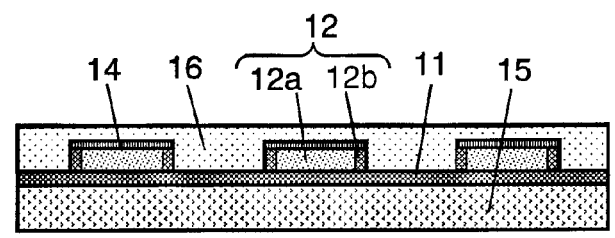
FIG. 10D is a cross-sectional view illustrating a step in the nonvolatile memory apparatus manufacturing method in accordance with the second embodiment of the present invention.

Next, in the step shown in FIGS. 10C and 10D, an insulator layer 16 is formed above the substrate 15 inclusive of the metal oxide resistance thin film layer 12 in the cross region of the first electrode wire 11 and the second electrode wire 13. An oxidation treatment process is carried out prior to the formation of the insulator layer 16. More specifically, a plasma treatment is carried out in an oxidation atmosphere. As a result of this, active oxygen, oxygen ions, or oxygen atoms are diffused into the metal oxide thin film layer 12 through the region covered by the connection electrode layer 14 shown in FIG. 8B (i.e., through the sidewalls of the metal oxide thin film layer 12 in the cross region 106 in FIG. 8B) and either join together in the outer peripheral region of the metal oxide thin film layer 12 or are taken thereinto. As a result of this, the outer peripheral region of the metal oxide thin film layer 12 is higher in the content or the ratio of composition of oxygen as compared to the internal region remaining in the same state as when the metal oxide thin film layer 12 was formed. Here, the internal and external regions of the metal oxide thin film layer 12 serve, respectively, as the first region 12a and as the second region 12b.

In addition, in the present embodiment, the second region 12b is formed prior to the formation of the insulator layer 16, as described above; however, the second region 12b may be formed by an oxygen-atmosphere plasma when forming the insulator layer 16.

Subsequently, the insulator layer 16 on the connection electrode layer 14 is opened by an exposure process, an etching process, or a CMP (Chemical Mechanical Polishing) process so that the connection electrode layer 14 is exposed.

Figure 11A:
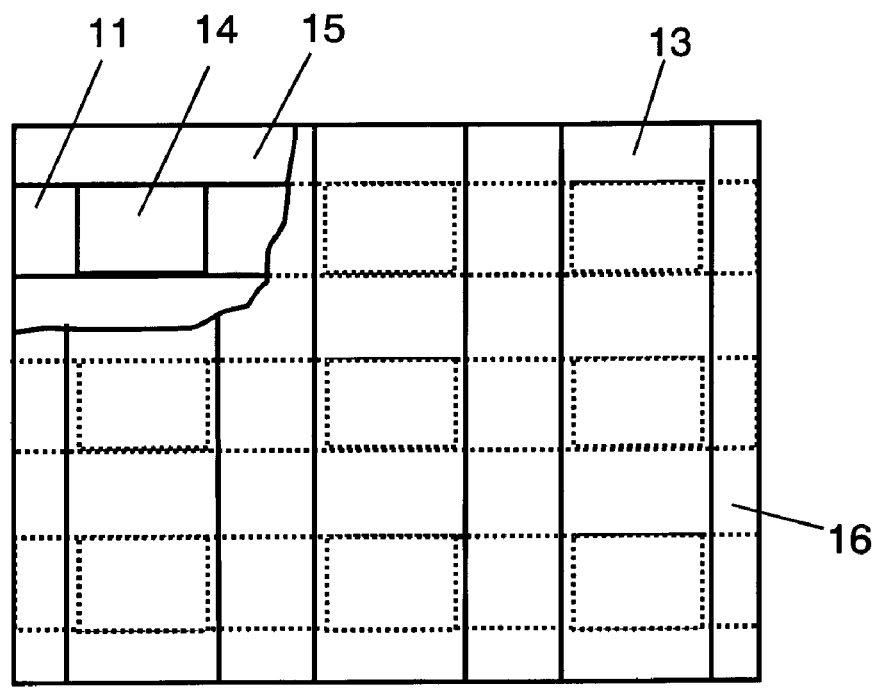
FIG. 11A is a top plan view illustrating a step in the nonvolatile memory apparatus manufacturing method in accordance with the second embodiment of the present invention.
Figure 11B:
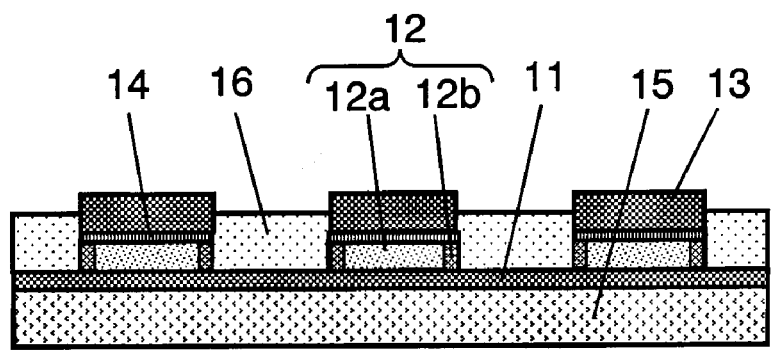
FIG. 11B is a cross-sectional view illustrating a step in the nonvolatile memory apparatus manufacturing method in accordance with the second embodiment of the present invention.

Next, in the step shown in FIGS. 11A and 11B, the second electrode wire 13 is formed such that the second electrode wire 13 is connected to the connection electrode layer 14 and crosses the first electrode wire 11. As the material to form the second electrode wire 13, electrode materials for use in semiconductor elements or conventional nonvolatile memory elements, such as aluminum (Al), copper (Cu), platinum (Pt) et cetera, can be employed. In addition, for the purpose of facilitating understanding, FIG. 11A illustrates the insulator layer 16 and the second electrode wire 13 in a partially cut away view.

By the above-described steps, the principal part of the memory section of the nonvolatile memory apparatus 10 in accordance with the present embodiment is now fabricated. In addition, the first and second electrode wires 11 and 13 formed in the way as described above are connected electrically to a semiconductor integrated circuit formed in the substrate 15. Consequently, the semiconductor integrated circuit is connected electrically to the lower and upper electrode layers in the nonvolatile memory apparatus 10. Also note that the process of forming the semiconductor integrated circuit is the same as conventional ones.

Although, in the nonvolatile memory apparatus 10 of the present embodiment, the contour shape in plan view of the connection electrode layer 14 and the contour shape in plan view of the upper electrode layer (the portion of the second electrode wire 13 in the cross region of the first electrode wire 11 and the second electrode wire 13) are identical with each other, they are not necessarily the same. The connection electrode layer 14 may be greater than the second electrode wire 13 or vice versa. In addition, the size of the metal oxide thin film layer 12 is not necessarily made to agree with the size of the connection electrode layer 14 and the upper electrode layer. The metal oxide thin film layer 12 may be greater than the connection electrode layer 14 and the upper electrode layer or vice versa.

Third Embodiment

For the case of the nonvolatile memory apparatus of the second embodiment, the metal oxide thin film layers of the nonvolatile memory elements arrayed in a matrix are mutually physically separated from one another. On the other hand, in a nonvolatile memory apparatus of a third embodiment of the present invention, the metal oxide thin film layers of the nonvolatile memory elements are formed integrally with one another, as will be described hereinafter. That is, the metal oxide thin film layers of the adjacent nonvolatile memory elements in the second embodiment constitute an integral layer in the third embodiment.

Structure of Nonvolatile Memory Apparatus

Figure 12A:
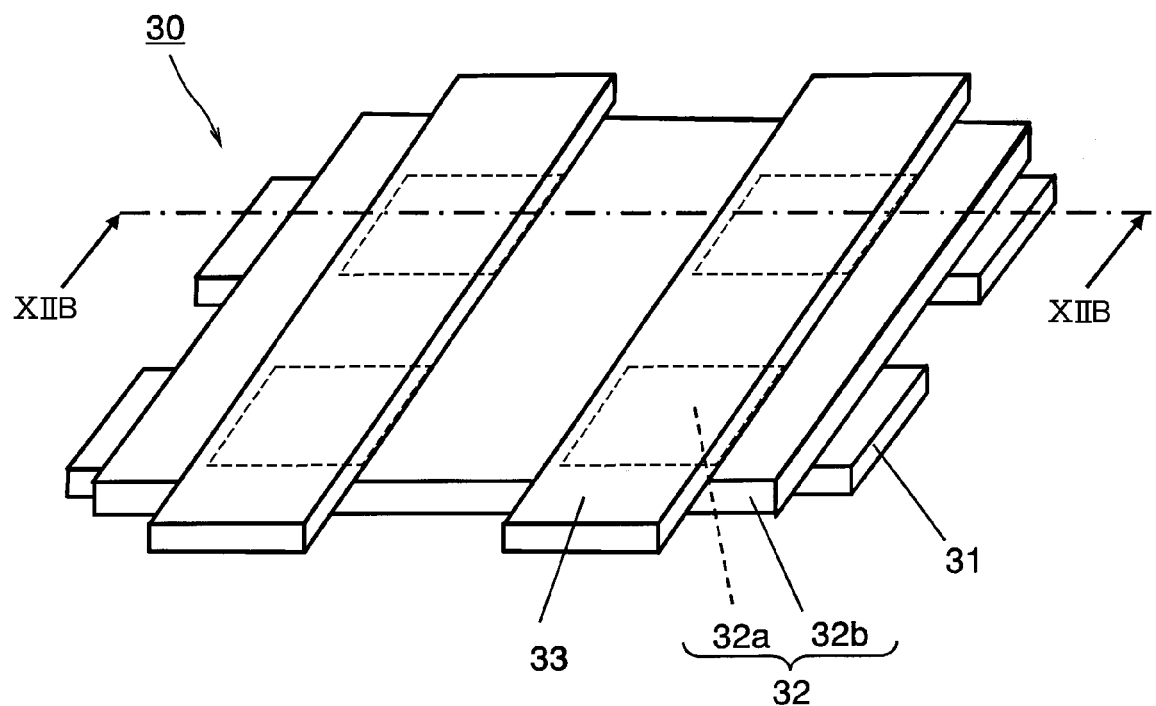
FIG. 12A is a perspective view illustrating schematically a structure of a principal part in a nonvolatile memory apparatus in accordance with a third embodiment of the present invention.
Figure 12B:
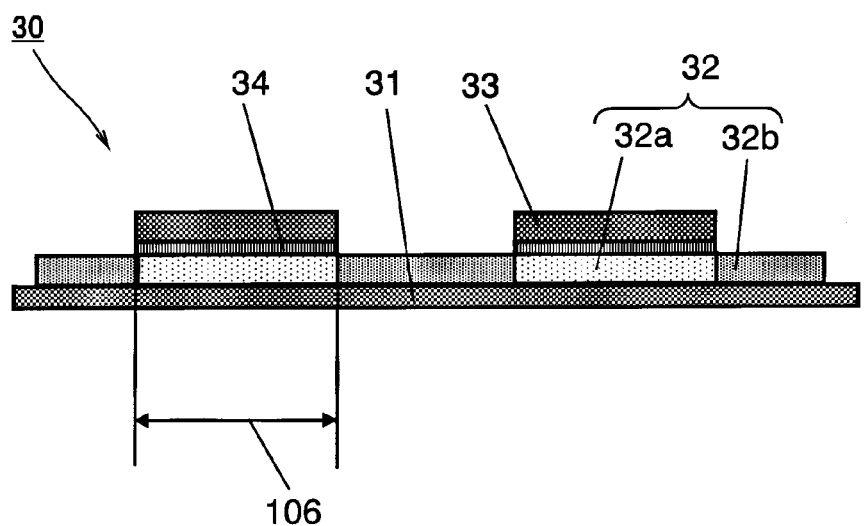
FIG. 12B is a cross-sectional view depicting a cross section taken along line XIIB-XIIB of FIG. 12A.

FIG. 12A is a perspective view illustrating schematically a structure of a principal part of the nonvolatile memory apparatus in accordance with the third embodiment of the present invention. FIG. 12B is a cross-sectional view depicting a cross section taken along line XIIB-XIIB of FIG. 12A. Also note that for the sake of convenience, some structural representation of the substrate, the interlayer dielectric layer and so on is omitted in FIGS. 12A and 12B.

As shown in FIGS. 12A and 12B, in the nonvolatile memory apparatus 30 of the present embodiment, a plurality of first electrode wires 31 are formed on a substrate (not shown). Each of the plurality of first electrode wires 31 is shaped like an elongated rectangle and is formed in parallel with the others within a first plane (not shown) parallel to a principal surface of the substrate. In addition, a plurality of second electrode wires 33 are formed over the substrate. Each of the plurality of second electrode wires 33 is shaped like an elongated rectangle and is formed in parallel with the others within a second plane (not shown) overlying and substantially parallel to the first plane. Therefore, the plurality of first electrode wires 31 and the plurality of second electrode wires 33 are orthogonal to one another in plan view, in other words the first and second electrode wires 31 and 33 cross one another three-dimensionally at right angles. A metal oxide thin film layer 32 is arranged in each of the cross regions of the plurality of first electrode wires 31 and the plurality of second electrode wires 33. Consequently, a memory cell is formed at each of the three-dimensional cross points of the plurality of first electrode wires 31 and the plurality of second electrode wires 33.

In addition, in the present embodiment, the portion of the first electrode wire 31 and the portion of the second electrode wire 33 in the cross region (represented by reference numeral 106 in FIG. 12B) of the first electrode wire 31 and the second electrode wire 33 constitute, respectively, a lower electrode layer and an upper electrode layer.

In addition, the portion of the metal oxide thin film layer 32 in the cross region 106 constitutes a first region 32a and the rest portion of the metal oxide thin film layer 32 constitutes a second region 32b. Therefore, the metal oxide thin film layer 32 is made up of a plurality of the first regions 32a arrayed in a matrix and the second region 32b arranged so as to enclose the outer periphery of the first regions 32a. The first region 32a functions as a variable resistance layer whose value of resistance increases or decreases by an electric pulse that is applied between the lower electrode layer and the upper electrode layer. In addition, the second region 32b is formed such that its content or ratio of composition of oxygen is larger than that of the first region 32a.

In addition, the second region 32b may be of such a structure that its content of oxygen grows gradiently towards the outer periphery from the region in abutment with the first region 32a.

As shown in FIG. 12B, a connection electrode layer 34 connected to the second electrode wire 33 is formed on the first region 32a of the metal oxide thin film layer 32 (note that the connection electrode layer is omitted in FIG. 12A). The first region 32a of the metal oxide thin film layer 32 is connected electrically to the second electrode wire 33 via the connection electrode layer 34.

The lower electrode layer (the portion of the first electrode wire 31 in the cross region 106) and the upper electrode layer (the portion of the second electrode wire 33 in the cross region 106), and the first region 32a of the metal oxide thin film layer 32 are arranged such that they overlap as viewed from the direction of the thickness of the first region 32a. In the example shown in FIGS. 12A and 12B, the entire first region 32a overlaps in plan view with the lower and upper electrode layers. However, the present invention is not limited to such a configuration, and it suffices if at least a part of the first region 32a overlaps with the lower and upper electrode layers as viewed from the direction of the thickness of the first region 32a.

In addition, one of the first electrode wire 31 and the second electrode wire 33 functions as a word line and the other electrode wire functions as a bit line.

As described above, in the present embodiment, the region sandwiched between the connection electrode layer 34 and the first electrode wire 31, i.e. the metal oxide resistance thin film layer 32 in the region corresponding substantially to the cross region 106 where the first electrode wire 31 and the second electrode wire 33 cross each other, serves as the first region 32a that functions as a variable resistance layer whose value of resistance varies by the application of an electric pulse. In addition, the metal oxide resistance thin film layer 32 exclusive of the cross region 106 is the second region 32b which is substantially an insulating layer. Here, the metal oxide resistance thin film layer 32 is formed of transition metal oxide. More specifically, the metal oxide resistance thin film layer 32 is formed of a thin film of iron oxide. The first region 32a is formed of triiron tetroxide ($Fe_3O_4$) and the second region 32b is formed of diiron trioxide ($Fe_2O_3$). Accordingly, the second region 32b has a larger content of oxygen than the first region 32a.

Additionally, as the material to form the first region 32a, transition metal oxide materials whose value of resistance increases as the amount of oxygen, x, increases, e.g., $NiO_x$, $TiO_x$ and so on, may be used. In this case, if x<y, $NiO_y$, $TiO_y$ and so on may be used as the second region 32b.

Although, as described above, the metal oxide resistance thin film layer 32 is formed continuously in the region inclusive of the cross region 106, the second region 32b has a larger content of oxygen than the first region 32a and also has a resistance value substantially approximate to that of the insulator. Therefore, even when the memory sections are arranged at high densities, the occurrence of crosstalk can be suppressed, thereby making it possible to fabricate a large-capacity nonvolatile memory element. On the other hand, the first region 32a varies reversibly in resistance value by an electric pulse, thereby making it possible to provide a memory section superior in reliability and having excellent characteristics.

In addition, also in the present embodiment, the rectifier element 19 connected electrically to either the first electrode wire 31 or the second electrode wire 33 may be provided, as described in the second embodiment.

Method of Manufacturing Nonvolatile Memory Apparatus

Next, a method of manufacture of the nonvolatile memory apparatus 30 will be described.

FIGS. 13A through 13D and FIGS. 14A through 14D are diagrams illustrating steps of the method of manufacture of the nonvolatile memory apparatus 30 in accordance with the third embodiment of the present invention. FIGS. 13A and 13C and FIGS. 14A and 14C are top plan views of a principal part of the nonvolatile memory apparatus 30. FIGS. 13B and 13D and FIGS. 14B and 14D are cross-sectional views taken along the first electrode wire 31.

In addition, although in fact a large number of the first electrode wires 31 and a large number of the second electrode wires 33 are formed in the nonvolatile memory apparatus 30, FIGS. 13A through 13D and FIGS. 14A through 14D show the nonvolatile memory apparatus 30 that is provided with three first electrode wires 32 and three second electrode wires 34. In addition, in order to facilitate understanding, some part is shown in an enlarged manner.

Figure 13A:
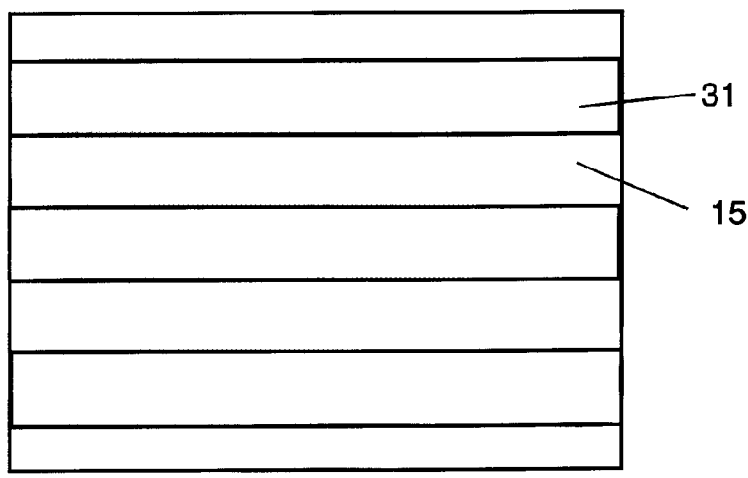
FIG. 13A is a top plan view illustrating a step in a method of manufacturing the nonvolatile memory apparatus in accordance with the third embodiment of the present invention.
Figure 13B:
FIG. 13B is a cross-sectional view illustrating a step in the nonvolatile memory apparatus manufacturing method in accordance with the third embodiment of the present invention.

In the first place, in the step shown in FIGS. 13A and 13B, the first electrode wire 31 is formed on the substrate 15 having on top thereof at least an insulating layer. The material and the method for forming the first electrode wire 31 are the same as described in the second embodiment, the description of which is omitted accordingly.

Figure 13C:
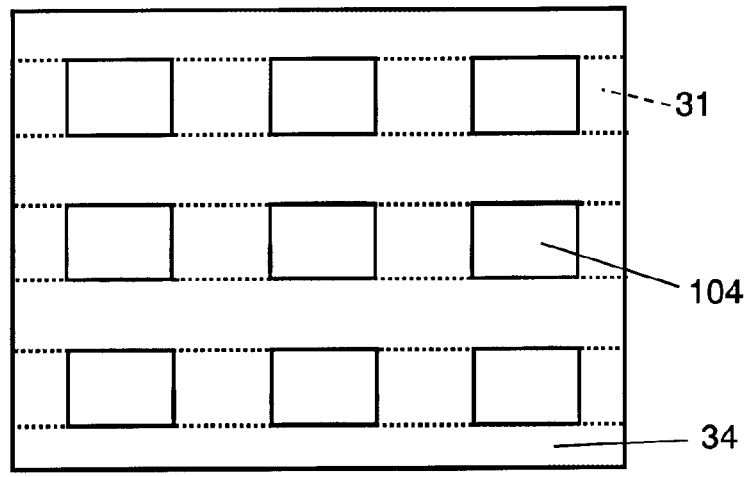
FIG. 13C is a top plan view illustrating a step in the nonvolatile memory apparatus manufacturing method in accordance with the third embodiment of the present invention.
Figure 13D:
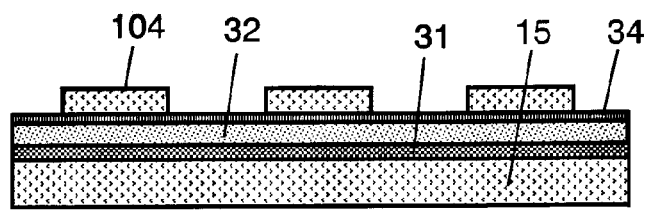
FIG. 13D is a cross-sectional view illustrating a step in the nonvolatile memory apparatus manufacturing method in accordance with the third embodiment of the present invention.

Next, in the step shown in FIGS. 13C and 13D, the metal oxide thin film layer 32 is formed. Furthermore, the connection electrode layer 34 is formed on the metal oxide thin film layer 32. Also note that the terms "metal oxide thin film layer 32" and "connection electrode layer 34" refer to not only those which have been etched to a predetermined pattern shape but also those which have been formed into films.

The material and the method for forming the metal oxide resistance thin film layer 32 are the same as described in the second embodiment, the description of which is omitted accordingly.

The connection electrode layer 34 may be formed of the same material as used to form the first electrode wire 31 and the second electrode wire 33 (formed later) or of a different material. It is, however, required to use materials that will not undergo deterioration (e.g., oxidation) at least in an atmosphere of an oxidation treatment performed with respect to the metal oxide thin film layer 32. In addition, it is also required to use materials having superior blocking properties against oxygen gas, oxygen atom et cetera. Accordingly, for example, the connection electrode layer 34 may be of a laminated structure of an electrode layer having superior oxygen barrier properties and an electrode layer free from oxidation.

Subsequently, the connection electrode layer 34 is etched, with the resist film 104 utilized as a mask.

Figure 14:
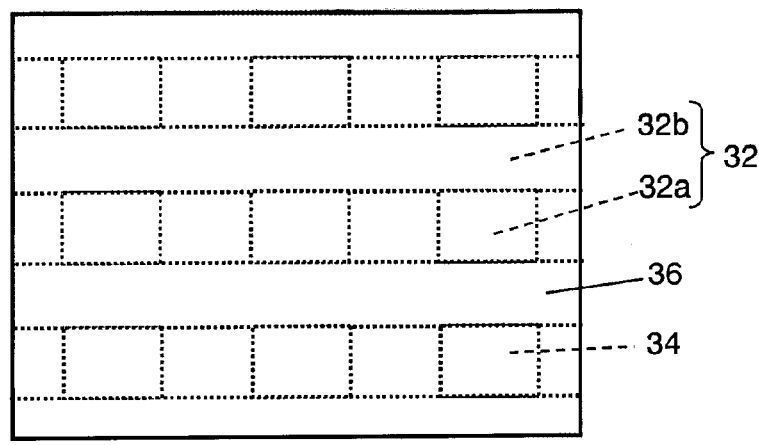
FIG. 14A is a top plan view illustrating a step in the nonvolatile memory apparatus manufacturing method in accordance with the third embodiment of the present invention.
FIG. 14B is a cross-sectional view illustrating a step in the nonvolatile memory apparatus manufacturing method in accordance with the third embodiment of the present invention.
FIG. 14C is a top plan view illustrating a step in the nonvolatile memory apparatus manufacturing method in accordance with the third embodiment of the present invention.
FIG. 14D is a cross-sectional view illustrating a step in the nonvolatile memory apparatus manufacturing method in accordance with the third embodiment of the present invention.
Figure 14:
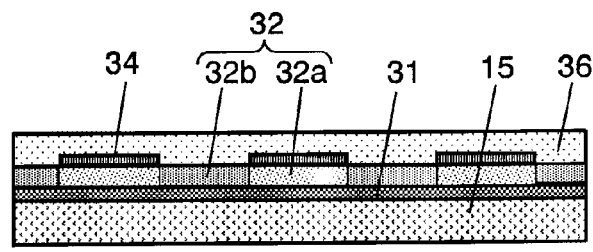
Figure 14:
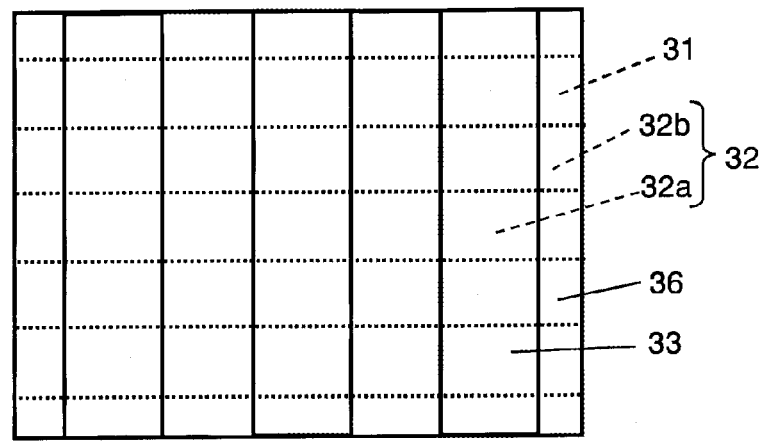
Figure 14:
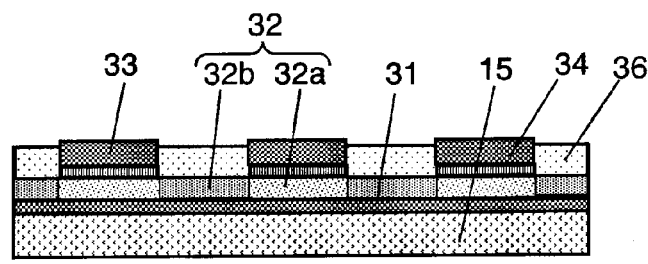

Next, in the step shown in FIGS. 14A and 14B, the metal oxide resistance thin film layer 32 is subjected to an oxygen treatment, with the connection electrode layer 34 utilized as a mask, which is followed by the formation of an insulator layer 36. This oxygen treatment process increases the content of oxygen in the portion of the metal oxide resistance thin film layer 32 other than the region thereof that is covered by the connection electrode layer 34, and as a result the second region 32b that is almost similar to an insulator is formed. The oxygen treatment process, as in the foregoing other embodiments, is achieved by at least either one of a heat treatment and a plasma treatment in an oxygen containing atmosphere. In this case, since the connection electrode layer 34 serves as a mask, the metal oxide resistance thin film layer 32 below the connection electrode layer 34 is not changed by the oxygen treatment and the portion of the metal oxide resistance thin film layer 32 in this region becomes the first region 32a which functions as a variable resistance layer whose value of resistance increases or decreases by the application of an electric pulse.

Subsequently, the insulator layer 36 on the connection electrode layer 34 is opened by an exposure process, an etching process, or a CMP (Chemical Mechanical Polishing) process so that the connection electrode layer 34 is exposed.

Next, in the step shown in FIGS. 14C and 14D, the second electrode wire 33 is formed such that the second electrode wire 33 is connected to the connection electrode layer 34 on the first region 32a and crosses the first electrode wire 31. The material and the method for forming the first electrode wire 33 are the same as described in the second embodiment, the description of which is omitted accordingly.

By the above-described steps, the principal part of the memory section of the nonvolatile memory apparatus 30 in accordance with the present embodiment is now fabricated. In addition, the first and second electrode wires 31 and 33 formed in the way as described above are connected electrically to a semiconductor integrated circuit formed in the substrate 15. Consequently, the semiconductor integrated circuit is connected electrically to the lower and upper electrode layers in the nonvolatile memory apparatus 30. Also note that the process of forming the semiconductor integrated circuit is the same as conventional ones.

As described above, in the nonvolatile memory apparatus 30 of the present embodiment, the portion of the metal oxide resistance thin film layer 32 that corresponds substantially to the cross region 106 of the first electrode wire 31 and the second electrode wire 33 becomes the first region 32a. In addition, as a result of the oxygen treatment, the second region 32b is formed in the portion of the metal oxide resistance thin film layer 32 other than the cross region 106. This makes it possible to simplify the manufacture process. Furthermore, since the second region 32b is arranged so as to enclose the first region 32a, the first region 32a is protected from being exposed to atmosphere gas, such as hydrogen gas, oxygen gas and so on, which gas will be used in the subsequent step. This facilitates the manufacture of the nonvolatile memory apparatus 30 having stable characteristics.

Although, in the nonvolatile memory apparatus 30 of the present embodiment, the contour shape in plan view of the connection electrode layer 34 and the contour shape in plan view of the upper electrode layer (the portion of the second electrode wire 33 in the cross region of the first electrode wire 31 and the second electrode wire 33) are identical with each other, they are not necessarily the same. The connection electrode layer 34 may be greater than the upper electrode layer or vice versa.

Structure of Nonvolatile Memory Apparatus of Modification

Figure 16A:
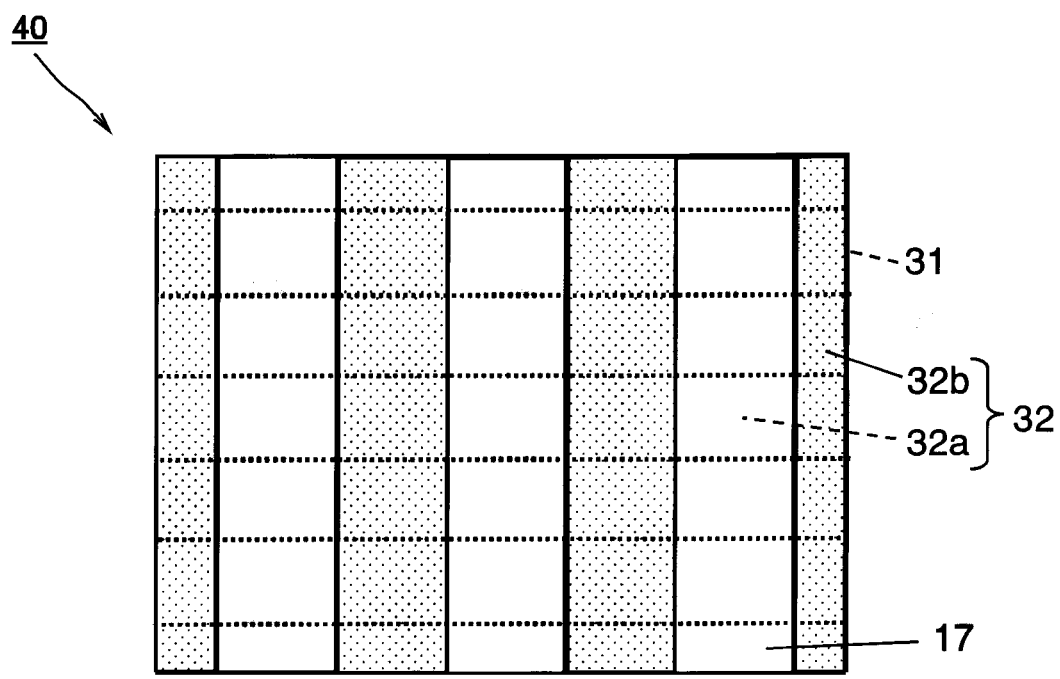
FIG. 16A is a top plan view illustrating a step in the nonvolatile memory apparatus manufacturing method in accordance with the modification of the third embodiment of the present invention.
Figure 16B:
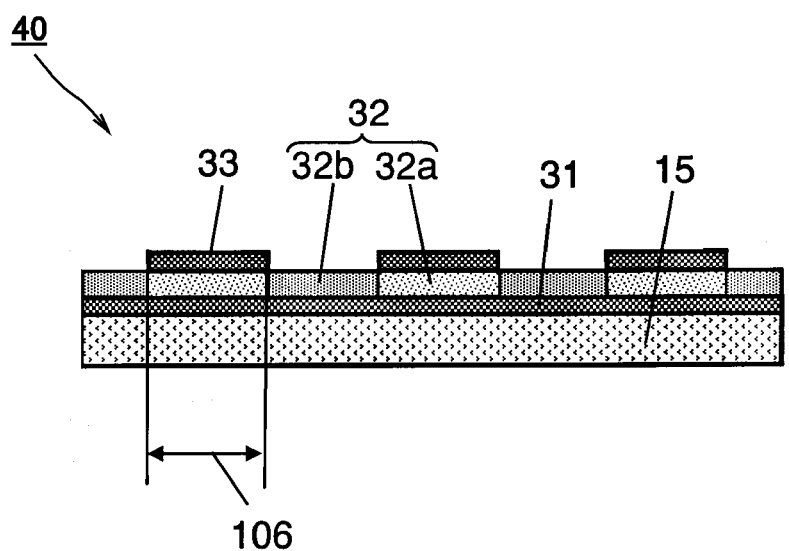
FIG. 16B is a cross-sectional view illustrating a step in the nonvolatile memory apparatus manufacturing method in accordance with the modification of the third embodiment of the present invention.

The difference between the nonvolatile memory apparatus according to a modification of the present embodiment and the above-described nonvolatile memory apparatus 30 is whether the connection electrode layer 34 is formed or not. In other words, in this modification, the connection electrode layer 34 is not provided. The structure thereof is shown in FIGS. 16A and 16B. In the nonvolatile memory apparatus 40 according to the modification shown in FIGS. 16A and 16B, the same reference numerals are assigned to the same elements as in the nonvolatile memory apparatus 30.

Method of Manufacturing Nonvolatile Memory Apparatus of Modification

Next, a method of manufacture of the nonvolatile memory apparatus 40 in accordance with the modification of the present embodiment will be described.

Figure 15A:
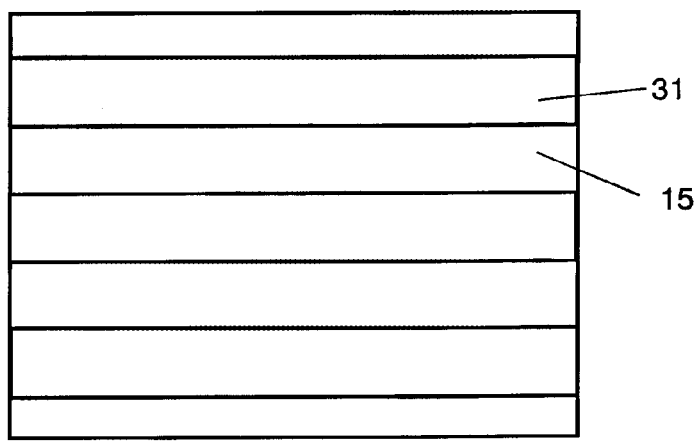
FIG. 15A is a top plan view illustrating a step in a method of manufacturing a nonvolatile memory apparatus in accordance with a modification of the third embodiment of the present invention.
Figure 15B:
FIG. 15B is a cross-sectional view illustrating a step in the nonvolatile memory apparatus manufacturing method in accordance with the modification of the third embodiment of the present invention.
Figure 15C:
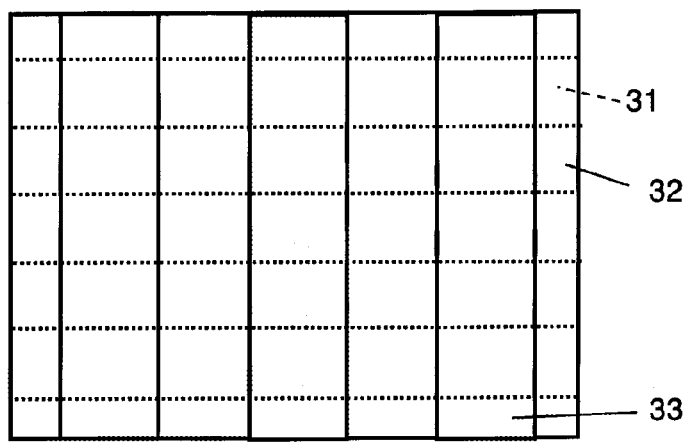
FIG. 15C is a top plan view illustrating a step in the nonvolatile memory apparatus manufacturing method in accordance with the modification of the third embodiment of the present invention.
Figure 15D:
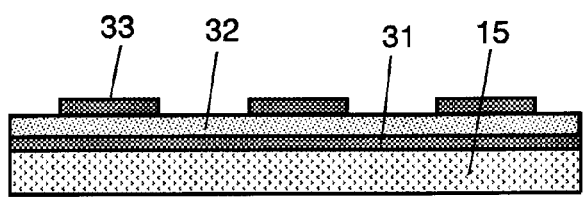
FIG. 15D is a cross-sectional view illustrating a step in the nonvolatile memory apparatus manufacturing method in accordance with the modification of the third embodiment of the present invention.

FIGS. 15A through 15D and FIGS. 16A and 16B are diagrams illustrating steps of the method of manufacture of the nonvolatile memory apparatus 40 in accordance with the modification of the third embodiment of the present invention. FIGS. 15A and 15C and FIG. 16A are top plan views illustrating a principal part of the nonvolatile memory apparatus 40. FIGS. 15B and 15D and FIG. 16B are cross-sectional views taken along the first electrode wire 31.

In the first place, in the step shown in FIGS. 15A and 15B, the first electrode wire 31 is formed on the substrate 15 having on top thereof at least an insulating layer. This step is the same as for the case of the nonvolatile memory apparatus 30.

Next, in the step as shown in FIGS. 13C and 13D, the metal oxide thin film layer 32 is formed. The process up to here is similar to that in the method of manufacture of the nonvolatile memory apparatus 30. However, for the case of the nonvolatile memory apparatus 40 of the modification, no connection electrode layer is formed on the metal oxide thin film layer 32 and the second electrode wire 33 is formed directly. After having undergone an exposure process and an etching process, the second electrode wire 33 is processed so as to cross the first electrode wire 31.

Subsequently, in the step shown in FIGS. 16A and 16B, the metal oxide thin film layer 32 is subjected to an oxygen treatment, with the second electrode wire 33 utilized as a mask. As a result of this oxygen treatment, the content of oxygen of the region not covered by the second electrode wire 33, that is, the metal oxide thin film layer 32 between the adjacent second electrode wires 33, increases, thereby forming the second region 32b which acts like an insulator. The oxygen treatment process, as in the foregoing other embodiments, is achieved by at least either one of a heat treatment and a plasma treatment in an oxygen containing atmosphere. In this case, since the second electrode wire 33 serves as a mask, the metal oxide resistance thin film layer 32 below the second electrode wire 33 is not changed by the oxygen treatment and the portion of the metal oxide resistance thin film layer 32 in this region becomes the first region 32a which functions as a variable resistance layer whose value of resistance increases or decreases by the application of an electric pulse.

For the second electrode wire 33, it is required to use a material that does not undergo deterioration even in an oxygen atmosphere but has superior blocking properties against oxygen gas, oxygen atom and so on. Therefore, the second electrode wire 33 may be of a laminated structure of a material having superior oxygen blocking properties and a material having superior conductivity.

By virtue of the above-described steps, the principal part of the memory section of the nonvolatile memory element 40 of the modification of the present embodiment is now fabricated. In addition, the first and second electrode wires 31 and 33 formed in the way as described above are connected electrically to a semiconductor integrated circuit formed in the substrate 15. Consequently, the semiconductor integrated circuit is connected electrically to the lower and upper electrode layers in the nonvolatile memory apparatus 40. Also note that the process of forming the semiconductor integrated circuit are the same as conventional ones.

As described above, in the nonvolatile memory apparatus 30 of the present embodiment, the portion of the metal oxide resistance thin film layer 32 that corresponds substantially to the cross region 106 of the first electrode wire 31 and the second electrode wire 33 becomes the first region 32a. In addition, as a result of the oxygen treatment, the second region 32b is formed in the portion of the metal oxide resistance thin film layer 32 other than the cross region 106. This makes it possible to simplify the manufacture process. Furthermore, since the second region 32b is arranged so as to enclose the first region 32a, the first region 32a is protected from being exposed to atmosphere gas, such as hydrogen gas, oxygen gas and so on, which gas will be used in the subsequent step. This facilitates the manufacture of the nonvolatile memory apparatus 30 having stable characteristics.

For the case of the nonvolatile memory apparatus 40 of the modification, no connection electrode layer is required, and the metal oxide thin film layer 32 in the region between the adjacent second electrode wires 33 can be made to serve as the second region 32b only by performing an oxygen treatment after the formation of the second electrode wires 33. Since it is possible to form the second region 32b in this way, this makes it possible to effectively prevent the occurrence of crosstalk even when reducing the interval between the second electrode wires 33 and also to fabricate a large-capacity nonvolatile memory apparatus by means of a simple process.

In addition, the metal oxide thin film layer 32 lying in the region between the adjacent first electrode wires 31 and underlying the second electrode wire 33 is not subjected to the oxygen treatment, so that it has the same properties as the first region 32a. However, if the pitch between the first electrode wires 31 is set to be the same as conventional ones, this makes it possible to ignore the effect of crosstalk.

Fourth Embodiment

For the case of a nonvolatile memory apparatus of a fourth embodiment, the arrangement that the metal oxide thin film layers of the nonvolatile memory elements arrayed in a matrix are physically separated from one another is the same as in the case of the second embodiment. However, unlike the second embodiment, in the nonvolatile memory apparatus of the fourth embodiment, the contour shape of the metal oxide thin film layer as viewed from the direction of the thickness of the metal oxide thin film layer is greater than the cross region of the first electrode wire and the second electrode wire.

Structure of Nonvolatile Memory Apparatus

Figure 17A:
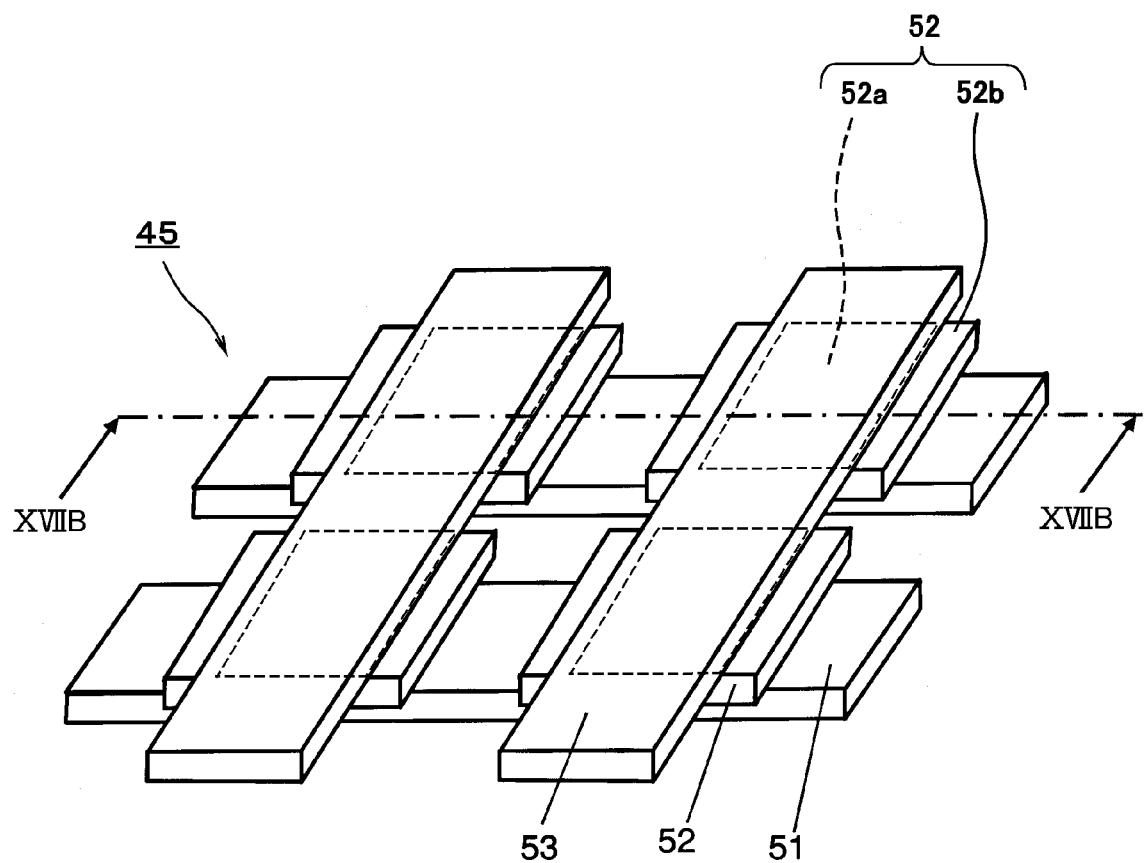
FIG. 17A is a perspective view illustrating schematically a structure of a principal part of a nonvolatile memory apparatus in accordance with a fourth embodiment of the present invention.
Figure 17B:
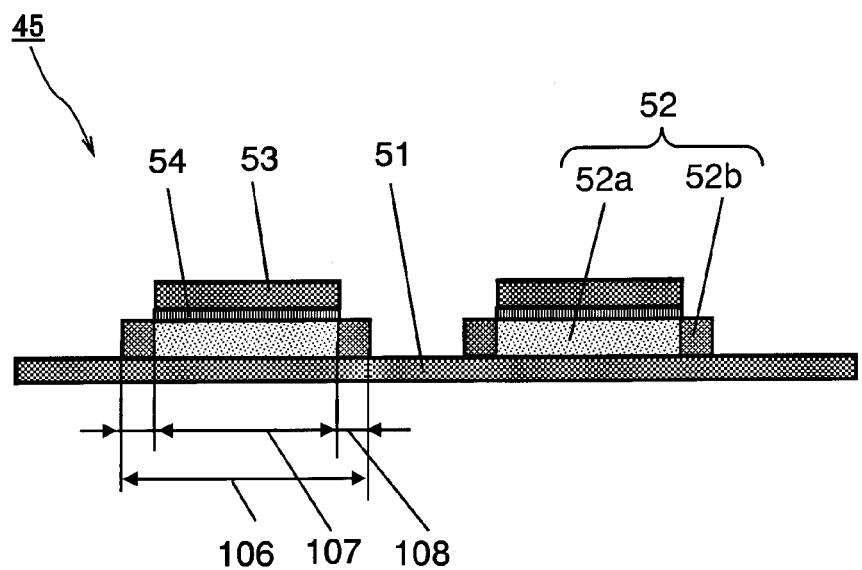
FIG. 17B is a cross-sectional view depicting a cross section taken along line XVIIB-XVIIB of FIG. 17A.

FIG. 17A is a perspective view illustrating schematically a principal part of the nonvolatile memory apparatus in accordance with the third embodiment of the present invention. FIG. 17B is a cross-sectional view depicting a cross section taken along line XVIIB-XVIIB of FIG. 17A. Also note that for the sake of convenience, some structural representation of the substrate, the interlayer dielectric layer and so on is omitted in FIGS. 17A and 17B.

As shown in FIGS. 17A and 17B, in the nonvolatile memory apparatus 45 of the present embodiment, a plurality of first electrode wires 51 each having an elongated rectangle shape are formed on a substrate (not shown) such that each first electrode wire 51 is arranged in parallel with the others within a first plane (not shown) parallel to a principal surface of the substrate. In addition, formed over the substrate are a plurality of second electrode wires 53 each overlying the first plane and arranged in parallel with the others within a second plane (not shown) substantially parallel to the first plane. Therefore, the plurality of first electrode wires 51 and the plurality of second electrode wires 53 are orthogonal to one another in plan view. A metal oxide thin film layer 52 is formed between the plurality of first electrode wires 51 and the plurality of second electrode wires 53. Consequently, a memory cell is formed at each of the three-dimensional cross points of the first electrode wires 51 and the second electrode wires 53.

In addition, in the present embodiment, the portion of the first electrode wire 51 and the portion of the second electrode wire 53 in the cross region (represented by reference numeral 107 in FIG. 17B) of the first electrode wire 51 and the second electrode wire 53 constitute, respectively, a lower electrode layer and an upper electrode layer.

The contour shape in plan view of the metal oxide thin film layer 52 is greater than the cross region 107 of the first electrode wire 51 and the second electrode wire 53. In FIG. 17B, the width of the metal oxide thin film layer 52 is denoted by reference numeral 106. In addition, the portion of the metal oxide thin film layer 52 in the cross region 107 constitutes a first region 52a and the rest portion of the metal oxide thin film layer 52 (denoted by reference numeral 108 in FIG. 17B) constitutes a second region 52b. Therefore, the metal oxide thin film layer 52 is made up of a plurality of the first regions 52a arrayed in a matrix and the second region 52b defined so as to enclose the outer periphery of these first regions 52a and the adjoining metal oxide thin film layers 52 are separated from each other. The first region 52a functions as a variable resistance layer whose value of resistance increases or decreases by an electric pulse that is applied between the lower electrode layer and the upper electrode layer. In addition, the second region 52b is formed such that its content or ratio of composition of oxygen is higher than the first region 52a.

In addition, the second region 52b may be of such a structure that its content of oxygen grows gradiently towards the outer periphery from the region in abutment with the first region 52a.

As shown in FIG. 17B, a connection electrode layer 54 connected to the second electrode wire 53 is formed over the first region 52a of the metal oxide thin film layer 52 (note that the representation of the connection electrode layer is omitted in FIG. 17A). The first region 52a of the metal oxide thin film layer 52 is electrically connected via the connection electrode layer 54 to the second electrode wire 53.

The lower electrode layer (the portion of the first electrode wire 51 in the cross region 107) and the upper electrode layer (the portion of the second electrode wire 53 in the cross region 107), and the first region 52a of the metal oxide thin film layer 52 are arranged such that they overlap as viewed from the direction of the thickness of the first region 52a.

In addition, one of the first electrode wire 51 and the second electrode wire 53 functions as a word line and the other electrode wire functions as a bit line.

As described above, in the present embodiment, the metal oxide resistance thin film layer 52 in the region corresponding substantially to the cross region 107 of the first electrode wire 51 and the second electrode wire 53 becomes the first region 52a that functions as a variable resistance layer whose value of resistance varies by the application of an electric pulse. In addition, the metal oxide resistance thin film layer 52 except for the cross region 107 is the second region 52b which is substantially an insulating layer.

In addition, also in the present embodiment, the rectifier element 19 connected electrically to either the first electrode wire 31 or the second electrode wire 33 may be provided, as described in the second embodiment.

Method of Manufacturing Nonvolatile Memory Apparatus

Next, a method of manufacture of the nonvolatile memory apparatus 45 will be described.

FIGS. 18A through 18D, FIGS. 19A through 19D, and FIGS. 20A and 20B are views illustrating steps of the method of manufacture of the nonvolatile memory apparatus 45 in accordance with the fourth embodiment of the present invention. FIGS. 18A and 18C, FIGS. 19A and 19C, and FIG. 20A are top plan views illustrating a principal part of the nonvolatile memory apparatus 45. FIGS. 18B and 18D, FIGS. 19B and 19D, and FIG. 20B are cross-sectional views taken along the first electrode wire 51.

Figure 18A:
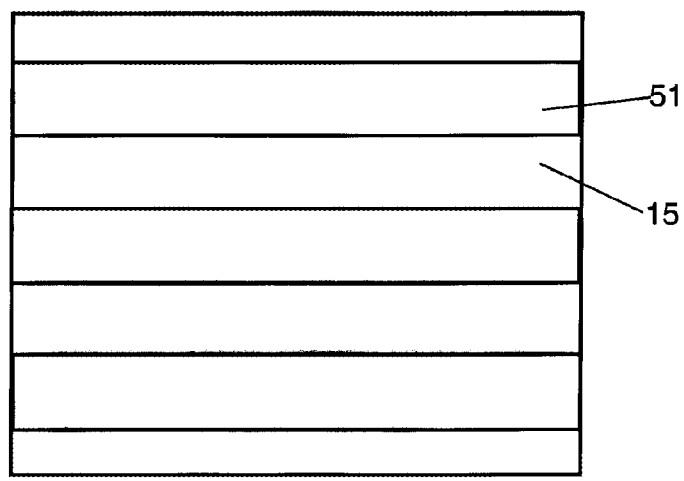
FIG. 18A is a top plan view illustrating a step in a method of manufacturing a nonvolatile memory apparatus in accordance with the fourth embodiment of the present invention.
Figure 18B:
FIG. 18B is a cross-sectional view illustrating a step in the nonvolatile memory apparatus manufacturing method in accordance with the fourth embodiment of the present invention.

In the step shown in FIGS. 18A and 18B, the first electrode wire 51 is formed on the substrate 15 having on top thereof at least an insulating layer. The material and the method for forming the first electrode wire 51 are the same as described in the second embodiment, the description of which is omitted accordingly.

Figure 18C:
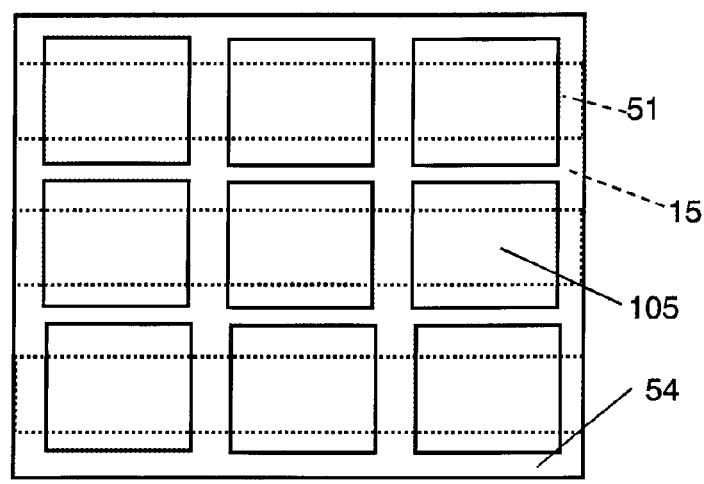
FIG. 18C is a top plan view illustrating a step in the nonvolatile memory apparatus manufacturing method in accordance with the fourth embodiment of the present invention.
Figure 18D:
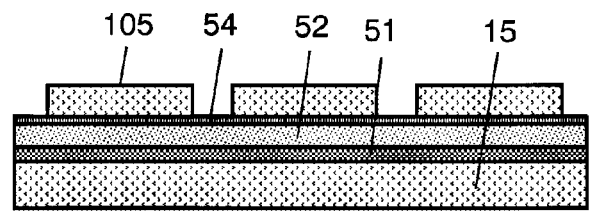
FIG. 18D is a cross-sectional view illustrating a step in the nonvolatile memory apparatus manufacturing method in accordance with the fourth embodiment of the present invention.

Subsequently, in the step shown in FIGS. 18C and 18D, the metal oxide thin film layer 52 whose value of resistance varies reversibly by an electric pulse. Thereafter, the connection electrode layer 54 is formed overlying the oxide resistance thin film layer 52.

Next, in order to process the metal oxide thin film layer 52 into a predetermined pattern shape, a resist film 105 is formed. The contour shape in plan view of the resist film 105 is larger than the cross region where the first electrode wire 51 and the second electrode wire 53 formed in the subsequent step cross over each other.

Figure 19A:
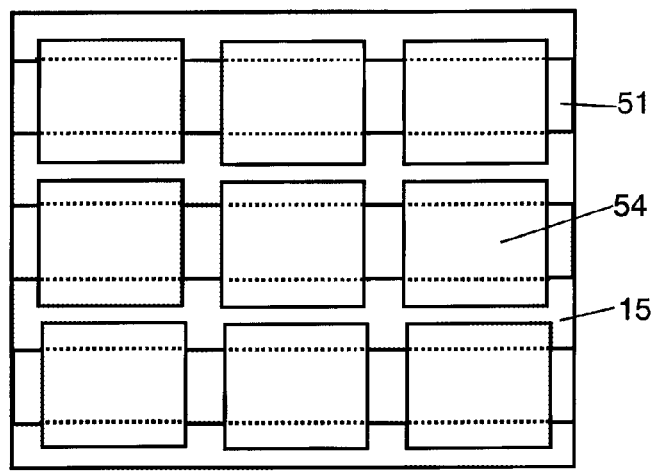
FIG. 19A is a top plan view illustrating a step in the nonvolatile memory apparatus manufacturing method in accordance with the fourth embodiment of the present invention.
Figure 19B:
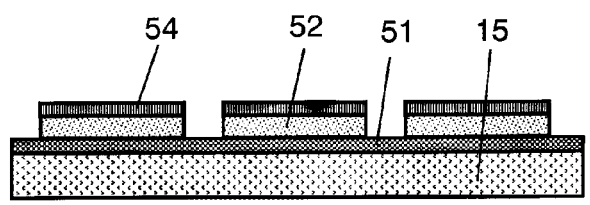
FIG. 19B is a cross-sectional view illustrating a step in the nonvolatile memory apparatus manufacturing method in accordance with the fourth embodiment of the present invention.

Next, in the step shown in FIGS. 19A and 19B, the connection electrode layer 54 and the metal oxide resistance thin film layer 52 are etched utilizing the resist film 105 as a mask. And, after the completion of the etching, the resist film 105 is removed away.

Figure 19C:
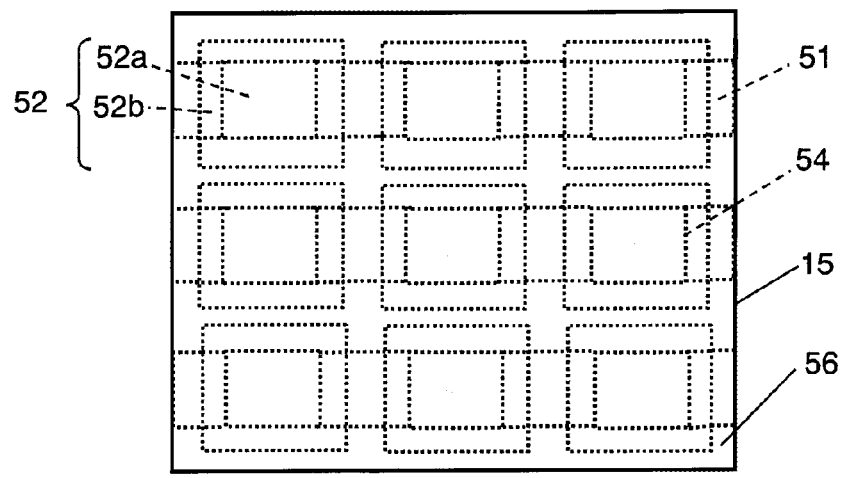
FIG. 19C is a top plan view illustrating a step in the nonvolatile memory apparatus manufacturing method in accordance with the fourth embodiment of the present invention.
Figure 19D:
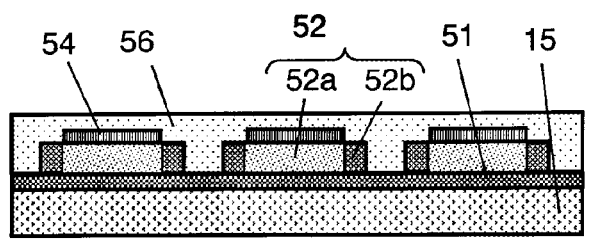
FIG. 19D is a cross-sectional view illustrating a step in the nonvolatile memory apparatus manufacturing method in accordance with the fourth embodiment of the present invention.

Next, in the step shown in FIGS. 19C and 19D, an insulator layer 56 is formed above the substrate 15 inclusive of the metal oxide resistance thin film layer 52. An oxidation treatment process is carried out prior to the formation of the insulator layer 56. More specifically, a plasma treatment is carried out in an oxidation atmosphere. As a result of this, active oxygen, oxygen ions, or oxygen atoms are diffused into the metal oxide thin film layer 52 through the sidewalls thereof and either join together in the outer peripheral region of the metal oxide thin film layer 52 or are taken thereinto. Consequently, the outer peripheral region of the metal oxide thin film layer 52 has a larger content of oxygen or a higher ratio of composition of oxygen than the internal region remaining in the same state as when film-formed. Here, the internal and external regions of the metal oxide thin film layer 52 serve, respectively, as the first region 52a and as the second region 52b.

In addition, in the present embodiment, the second region 52b is formed prior to the formation of the insulator layer 56, as described above; however, for example, the second region 52b may be formed by an oxygen-atmosphere plasma when forming the insulator layer 56.

Subsequently, the insulator layer 56 on the connection electrode layer 54 is opened by an exposure process, an etching process, or a CMP (Chemical Mechanical Polishing) process so that the connection electrode layer 54 is exposed.

Figure 20A:
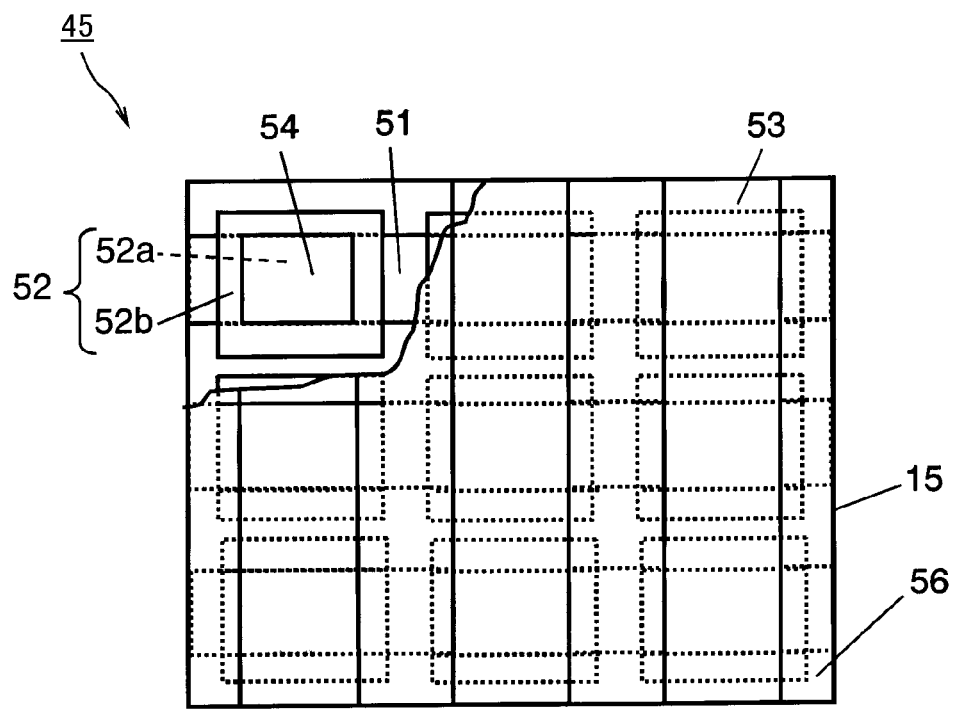
FIG. 20A is a top plan view illustrating a step in the nonvolatile memory apparatus manufacturing method in accordance with the fourth embodiment of the present invention.
Figure 20B:
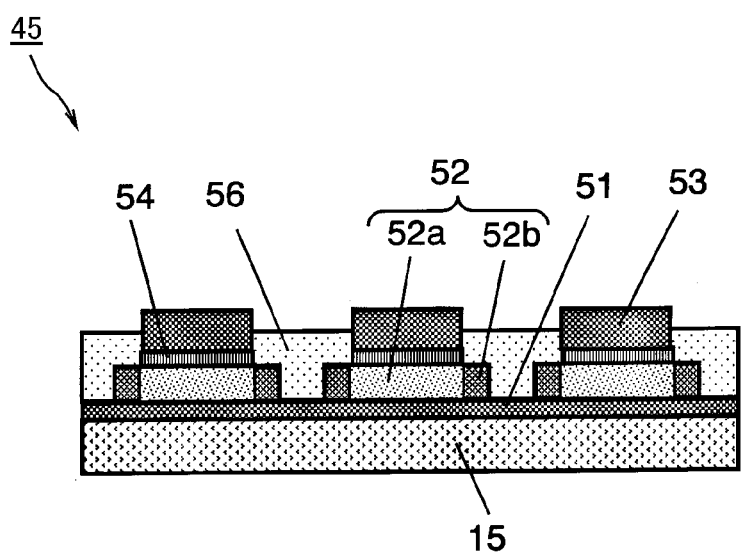
FIG. 20B is a cross-sectional view illustrating a step in the nonvolatile memory apparatus manufacturing method in accordance with the fourth embodiment of the present invention.
Figure 21:
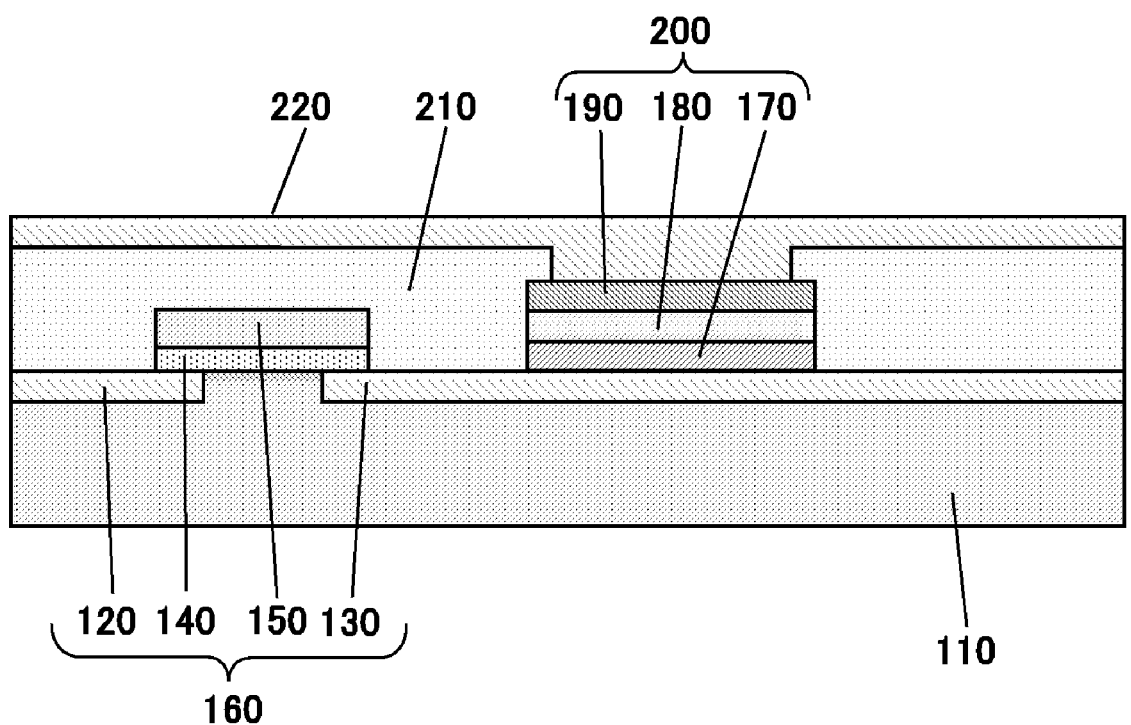
FIG. 21 is a principal part cross-sectional view illustrating a structure of a nonvolatile memory element in a first conventional example.
Figure 22A:
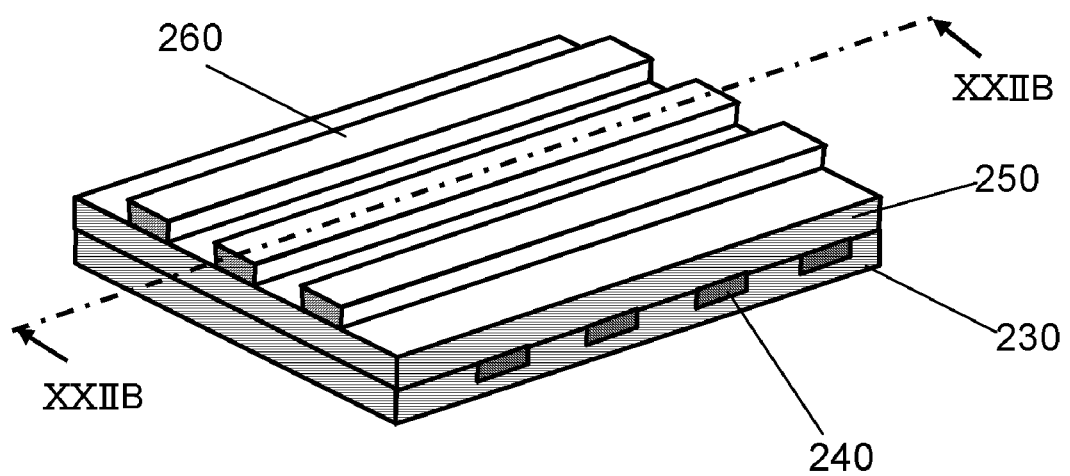
FIG. 22A is a perspective view illustrating a structure of a nonvolatile memory element in a second conventional example.
Figure 22B:
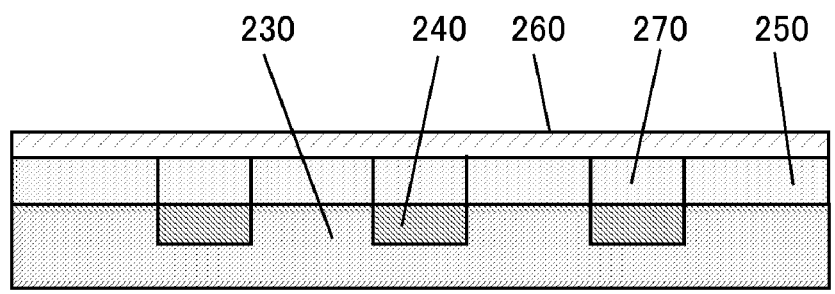
FIG. 22B is a cross-sectional view depicting a cross section taken along line XXIIB-XXIIB of FIG. 22A.

Next, in the step shown in FIGS. 20A and 20B, the second electrode wire 53 is formed such that the second electrode wire 53 is connected to the connection electrode layer 54 and crosses the first electrode wire 51. The material and the method for forming the second electrode wire 53 are the same as explained in the second embodiment. In addition, for the purpose of facilitating understanding, FIG. 20A illustrates the insulator layer 56 and the second electrode wire 53 in a partially cut away view.

By the above-described steps, the principal part of the memory section of the nonvolatile memory apparatus 45 in accordance with the present embodiment is now fabricated. In addition, the first and second electrode wires 51 and 53 formed in the way as described above are connected electrically to a semiconductor integrated circuit formed in the substrate 15. Consequently, the semiconductor integrated circuit is connected electrically to the lower and upper electrode layers in the nonvolatile memory apparatus 45. Also note that the process of forming the semiconductor integrated circuit is the same as conventional ones.

Like the other embodiments, the effect of suppressing damage to the sidewalls of the metal oxide thin film layer or other effect is accomplished, even when the contour shape of the metal oxide thin film layer in the direction of the thickness thereof is greater than the cross region of the first electrode wire and the second electrode wire.

In addition, in the first through fourth embodiments, the description has been made as to an example in which the metal oxide thin film layer is formed of transition metal oxides such as iron oxide, nickel oxide, and titanium oxide. However, the present invention is not limited to these oxides. As described above, any other transition oxide whose value of resistance increases as the amount of oxygen with respect to the metal increases maybe used. In addition, it is not required that the contour shape in plan view of each of the lower electrode layer, the oxide resistance thin film layer, the upper electrode layer, and the connection electrode layer be accurately the same as the others, as shown in each figure. It does not matter if there is a side etch taking place in normal etching or there is a difference in the pattern shape made when etched individually.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention.

INDUSTRIAL APPLICABILITY

Since the cipher key generation method, the cipher key generation system, the cipher arithmetic circuit, the wireless tag, and the computer program in accordance with the present invention are able to secure security with less amounts of calculation, the present invention is useful for the case where cipher and decode processing operations are carried out in a wireless tag system provided with a wireless tag having the constraint of being limited to very small power and circuit size applications, a variety of computer systems and so on.

What is claimed is:

1. A nonvolatile memory element, comprising:
a lower electrode layer;
an upper electrode layer formed above the lower electrode layer; and
a metal oxide thin film layer formed between the lower electrode layer and the upper electrode layer,
wherein the metal oxide thin film layer includes a first region whose value of resistance increases or decreases by an electric pulse that is applied between the lower electrode layer and the upper electrode layer and a second region arranged around the first region and having a larger content of oxygen than the first region; and
wherein
an outer peripheral surface of at least one of the lower electrode layer and the upper electrode layer is not flush (coplanar or aligned) with an outer peripheral surface of the second region.

2. The nonvolatile memory element as set forth in claim 1, wherein the metal oxide thin film layer is formed of a transition metal oxide material.

3. The nonvolatile memory element as set forth in claim 1, wherein the first and second regions are formed of an identical element.

4. The nonvolatile memory element as set forth in claim 1, wherein the second region is formed such that the value of resistance of the second region is larger than the value of resistance of the first region in the case where the value of resistance of the first region increases by the application of an electric pulse between the lower electrode layer and the upper electrode layer.

5. The nonvolatile memory element as set forth in claim 1, wherein the metal oxide thin film layer is formed of an iron oxide thin film and the first region is formed of triiron tetroxide ($Fe_3O_4$).

6. The nonvolatile memory element as set forth in claim 1, wherein the second region is formed of diiron trioxide ($Fe_2O_3$).

7. The nonvolatile memory element according to claim 1, wherein an outer shape of at least one of the upper electrode layer, the metal oxide thin film layer and the lower electrode layer is not identical to an outer shape of remaining layers.

8. The nonvolatile memory element according to claim 1, wherein an outer shape of the upper electrode layer is larger in dimension than an outer shape of the metal oxide thin film layer.

9. The nonvolatile memory element according to claim 1, wherein an outer shape of the lower electrode layer is larger in dimension than an outer shape of the metal oxide thin film layer.

10. A method of manufacturing a nonvolatile memory element, the memory element including a lower electrode layer; an upper electrode layer formed above the lower electrode layer; and a metal oxide thin film layer formed between the lower electrode layer and the upper electrode layer, the method comprising the steps of:
forming the metal oxide thin film layer on the lower electrode layer;
forming the upper electrode layer on the metal oxide thin film layer; and
performing at least either one of a heat treatment and a plasma treatment on the metal oxide thin film layer in an oxygen-containing atmosphere to thereby form, in the metal oxide thin film layer, a first region whose value of resistance increases or decreases by an electric pulse that is applied between the lower electrode layer and the upper electrode layer and a second region arranged around the first region and having a larger content of oxygen than the first region,
wherein the lower electrode layer, the upper electrode layer and the metal thin film oxide layer are formed such that an outer peripheral surface of at least one of the lower electrode layer and the upper electrode layer is not flush (coplanar or aligned) with an outer peripheral surface of the second region.

* * * * *